United States Patent
Kasahara et al.

(10) Patent No.: US 8,842,211 B2
(45) Date of Patent: Sep. 23, 2014

(54) IMAGING ELEMENT AND IMAGING APPARATUS THAT EXTRACT LIGHT OF A SPECIFIC WAVELENGTH

(75) Inventors: Ryosuke Kasahara, Yokohama (JP); Hideaki Hirai, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 483 days.

(21) Appl. No.: 13/146,270

(22) PCT Filed: Jan. 26, 2010

(86) PCT No.: PCT/JP2010/051314
§ 371 (c)(1),
(2), (4) Date: Jul. 26, 2011

(87) PCT Pub. No.: WO2010/085000
PCT Pub. Date: Jul. 29, 2010

(65) Prior Publication Data
US 2011/0285898 A1 Nov. 24, 2011

(30) Foreign Application Priority Data
Jan. 26, 2009 (JP) .................................. 2009-014195

(51) Int. Cl.
*H04N 5/225* (2006.01)
*H04N 5/228* (2006.01)

(52) U.S. Cl.
USPC ........................................ 348/342; 348/224.1

(58) Field of Classification Search
USPC .......................................................... 348/342
See application file for complete search history.

(56) References Cited

U.S. PATENT DOCUMENTS

| | | | |
|---|---|---|---|
| 6,345,116 B1 * | 2/2002 | Kojima et al. | 382/167 |
| 7,566,180 B2 * | 7/2009 | Kurosawa | 396/449 |
| 7,796,814 B2 | 9/2010 | Sato et al. | |
| 8,189,091 B2 * | 5/2012 | Higuchi | 348/349 |
| 8,471,999 B2 * | 6/2013 | Valyukh et al. | 349/200 |
| 2004/0160519 A1 * | 8/2004 | Horita | 348/234 |
| 2004/0189818 A1 * | 9/2004 | Tsuruoka et al. | 348/221.1 |
| 2007/0183020 A1 * | 8/2007 | Hikmet | 359/279 |
| 2009/0009668 A1 * | 1/2009 | Tan et al. | 349/1 |
| 2009/0115011 A1 * | 5/2009 | Ushiro et al. | 257/432 |
| 2009/0238455 A1 | 9/2009 | Kasahara | |

FOREIGN PATENT DOCUMENTS

| | | |
|---|---|---|
| CN | 101283453 A | 10/2008 |
| JP | 11 018095 | 1/1999 |
| JP | 2000 278503 | 10/2000 |
| JP | 2005 167356 | 6/2005 |
| JP | 2005 318465 | 11/2005 |
| JP | 2007 86720 | 4/2007 |
| JP | 2007 109801 | 4/2007 |
| JP | 4144630 | 9/2008 |
| JP | 2009 225286 | 10/2009 |
| TW | 200702956 | 1/2007 |

OTHER PUBLICATIONS

Combined Office Action and Search Report issued Jun. 9, 2013 in Chinese Patent Application No. 201080005436.X with English language translation.
Combined Taiwanese Office Action and Search Report issued Mar. 14, 2013, in Patent Application No. 099102143 (with English-language translation).
International Search Report issued Apr. 20, 2010 in PCT/JP10/051314 filed Jan. 26, 2010.

* cited by examiner

*Primary Examiner* — Ngoc-Yen Vu
(74) *Attorney, Agent, or Firm* — Oblon, Spivak, McClelland, Maier & Neustadt, L.L.P.

(57) ABSTRACT

An imaging element includes a light receiving surface having pixels, and a low-pass filter device configured to focus predetermined light on a predetermined pixel of the pixels of the light-receiving surface.

12 Claims, 31 Drawing Sheets

CENSOR FILTER ARRAY
2 = RED FILTER, 3 = BLUE FILTER

FIG.12

CENSOR FILTER ARRAY
2=P-POLARIZER, 3 = S-POLARIZER

US 8,842,211 B2

IMAGING ELEMENT AND IMAGING APPARATUS THAT EXTRACT LIGHT OF A SPECIFIC WAVELENGTH

This application is based on and claims priority from Japanese Patent Application No. 2009-014195, filed on Jan. 26, 2009, the disclosure of which is incorporated herein by reference in its entirety.

TECHNICAL FIELD

The present invention relates to an imaging element which is used in an imaging apparatus such as a digital camera, or the like and an imaging apparatus having the same.

BACKGROUND ART

Conventionally, for use of a back-monitor of a vehicle, an high sensitive imaging apparatus capable of obtaining a color image has been known. Recently, multifunctional imaging apparatus capable of, for example, imaging a polarized image for detecting a wet state of a road surface with a high sensitivity has been required.

In a conventional technique, when a color image or a polarized image is obtained, methods for demosicing an obtained image by providing a color filter on each pixel of the imaging element (see, for example, Japanese Patent Application Publication No. 2000-278503), or disposing a micro-polarizer (see, for example, Japanese Patent Application Publication No. 2007-86720) has been generally used.

However, for example when a RGB primary color filter is used, simply, a light amount received by each pixel is reduced to one-third of a light amount in a case where the filter is not used. Furthermore, in a case where a polarizer is used, since only a light amount of either P-polarized light or S-polarized light, that is, ½ of total light amount is received by each pixel, the light amount received by each pixel is reduced to ½ of light amount in a case where the filter is not used is received by each pixel. Therefore, there is a problem in that sensitivity is degraded in principle. Furthermore, resolution of brightness information is degraded compared to the case where the filter is not used, so that low resolution of an obtained image is visible to the human eyes.

In order to solve the above problems, regarding a filter array to obtain an color image, for example, it has been proposed that pixels without filter are added to a color filter array in order to obtain brightness information with the fact that sensitivity of the human eyes to brightness signals is higher than that to color signals (see Japanese Patent No. 4144630).

However, in the above conventional technology, there are problems in that, for example, when combining the brightness information and the color information, if a sampling period of the color information is small in relation to the brightness information, aliasing noise occurring in the color information causes degrade in a quality of an image so that ratio of the pixels without filter cannot be increased.

Furthermore, there is a problem in that due to a large difference between the receiving light amount of the pixel with a filter and the receiving light amount of the pixel without a filter, only the light amount of the pixel without filter is saturated so that normal color reproduction cannot be achieved.

SUMMARY OF INVENTION

The present invention is to provide an imaging element capable of achieving a normal color reproduction as well as high resolution and sensitivity can be achieved and ratio of pixels without filter can be increased, and an imaging apparatus using the imaging element.

In order to achieve the above object, an imaging element according to an embodiment of the present invention includes a light receiving surface having pixels, a low-pass filter device configured to focus predetermined light on a predetermined pixel of the pixels of the light-receiving surface.

BRIEF DESCRIPTION OF DRAWINGS

Figure 12:
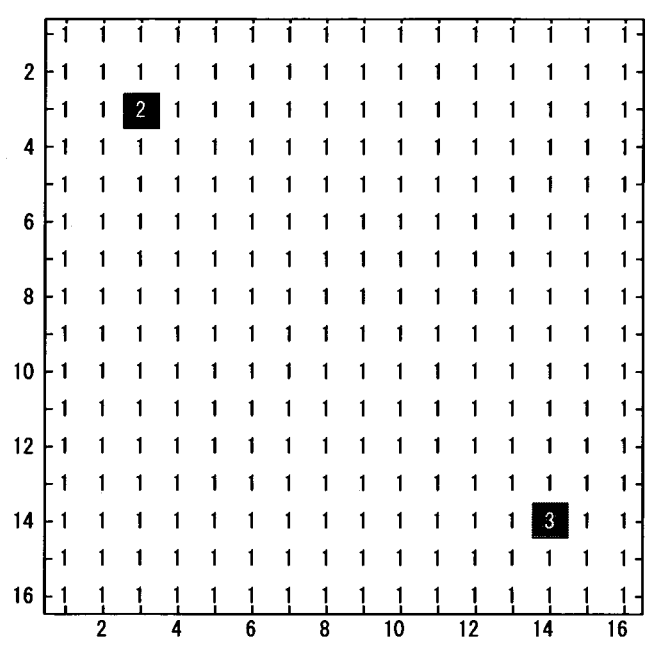

FIG. 12 is an explanatory view explaining a structure of a filter array having a period of 16×16 in a second embodiment.

MODE FOR CARRYING OUT THE INVENTION

Hereinafter, preferred embodiments of this invention will be described in detail based on the drawings.

Figure 1:
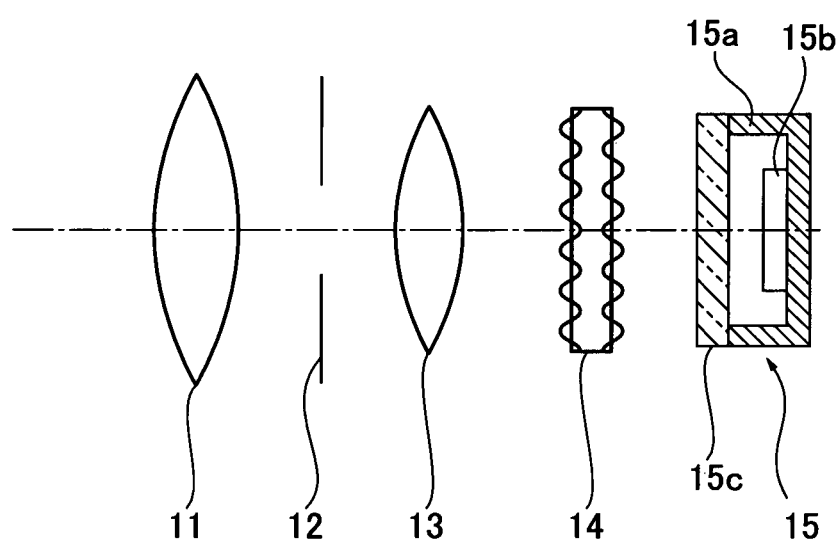
FIG. 1 is a schematic configuration diagram of an imaging optical system having an imaging element according to an embodiment of the present invention.

An imaging element according to an embodiment of the present invention includes, as illustrated in FIG. 1, a light receiving surface 15b having pixels, a low-pass filter device 14 such as a low-pass filter, a filter array having a low-pass filter (LPF) function or the like configured to focus predetermined light on a predetermined pixel or predetermined pixels of the pixels of the light-receiving surface 15b. The imaging element according to an embodiment of the present invention may be used in an imaging apparatus. The imaging apparatus may include a lens system 13 (11), the imaging element configured to image a subject to form a subject image via the lens system, and a control device (not shown) configured to process the subject image as image data.

First Embodiment

FIG. 1 is a configuration diagram illustrating an imaging optical system including an imaging element according to an embodiment of the present invention. A left side of FIG. 1 indicates a subject side and a right side of FIG. 1 indicates an imaging plane side. Reference number 11 indicates a lens system 11 formed by one or more lenses, reference number 12 indicates an aperture stop to set an F number within about 1 to 3, reference number 13 indicates a lens system formed by one or more lenses, and reference number 15 indicates an imaging element body. The lens system 11 is disposed at the subject side from the aperture stop 12 and the lens system 13 is disposed at the imaging plane side from the aperture stop 12. The lens system 11, the aperture stop 12 and the lens system 13 are disposed on an optical axis L.

On the optical axis L, the low-pass filter 14 and the imaging element body 15 are disposed in order from a side close to the lens system 13. In this embodiment, the imaging element body 15 may be separately provided or integrally provided with the low-pass filter 14

Next, structures of the imaging element body 15 and the low-pass filter 14 will be explained in detail.

[Imaging Element Body 15]

As the imaging element body 15, a known monochrome sensor such as a CCD, a CMOS, or the like may be used. The imaging element body 15 is protected by a package 15c depending on an intended use and a lens-side surface of the package 15c is sealed by a cover glass 15a. A light-receiving part 15b as the light-receiving surface is provided at a center portion of the package 15c sealed by the cover glass 15a. The light-receiving part 15b may have pixels each having a size of predetermined micrometers, for example, about 1 to 9 micrometers, and the light-receiving part may have hundreds of thousands pixels or about 10 million, as recently used. As the package 15c, a high thermally resistant package may be selected for using as a vehicle camera or an outdoor monitoring camera, and a small size package may be selected for using as a portable devices.

[Low-Pass Filter 14]

The low-pass filter 14 may be configured to extract a wavelength component of the predetermined light when focusing the predetermined light on the predetermined pixel or predetermined pixels of the light-receiving surface 15b.

The low-pass filter 14 is formed by a flat glass plate or a resin substrate having surfaces opposite each other, each surface being provided with diffracting structures.

Figure 2A:
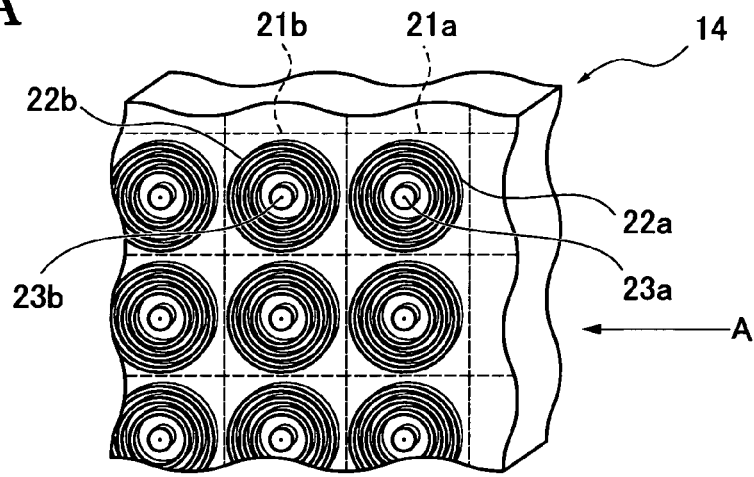
FIG. 2A is a perspective view illustrating a low-pass filter viewed from a side of a lens.

FIG. 2A is a perspective view illustrating an end portion of the low-pass filter, viewed from a side of the lens systems. One end surface of the low-pass filter 14, which is disposed at the side close to the lens system 13, is divided into a plurality of areas 21a, 21b, . . . . Each area 21a, 21b, . . . is configured to focus light transmitting the low-pass filter 14 on a plurality of pixels, for example, 4 pixels×4 pixels=16 pixels, of the light-receiving part 15b of the imaging element body 15.

In each area 21a, 21b, . . . , a concentric circular diffracting area 22a, 22b, . . . is formed. The diffracting area 22a is formed by a plurality of concentric circular bands about an optical axis 23a as a center, and the diffracting area 22b is formed by a plurality of concentric circular bands about an optical axis 23b as a center. A pitch (an interval) between the circular bands of a center part differs from that of a peripheral part to modulate the pitches between the circular bands.

According to such a modulation, the diffracting areas 22a, 22b can have a lens function. Light-focusing capability becomes higher with decreasing the pitch or the interval between the circular bands.

Figure 2B:
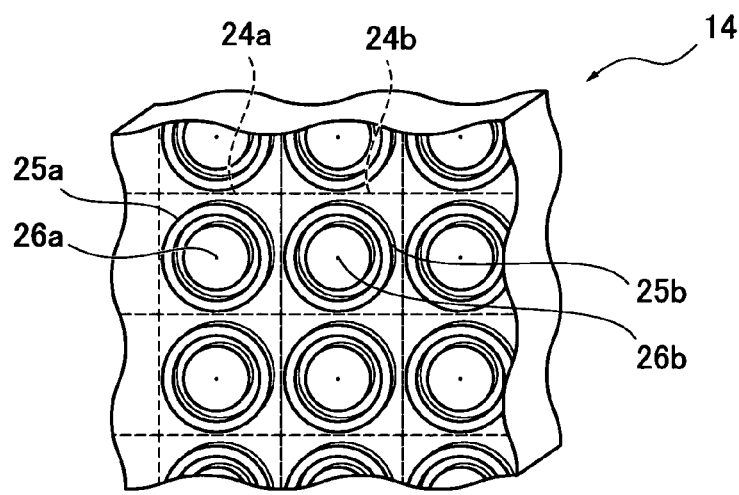
FIG. 2B is a perspective view illustrating the low-pass filter viewed from a side of an imaging element body.

FIG. 2B is a perspective view illustrating an end portion of the low-pass filter 14, viewed from a side of the imaging element body 15. The other end surface of the low-pass filter 14, which is disposed at a side close to the imaging element body 15, is divided into a plurality of areas 24a, 24b, . . . Each area 24a, 24b, . . . has a same area and each area 24a, 24b, . . . is configured to focus light transmitting the low-pass filter 14 on a plurality of pixels, for example, 4 pixels×4 pixels=16 pixels of the light-receiving part 15b of the imaging element body. The areas 24a, 24b, . . . are disposed substantially at opposite positions of the areas 21a, 21b, . . . , respectively.

In each area 24a, 24b, . . . , a concentric circular diffracting area 25a, 25b, . . . is formed. The diffracting area 25a is provided with a plurality of concentric circular bands about an optical axis 26a as a center and the diffracting area 26a is provided with a plurality of concentric circular bands about an optical axis 26b as a center.

Figure 2C:
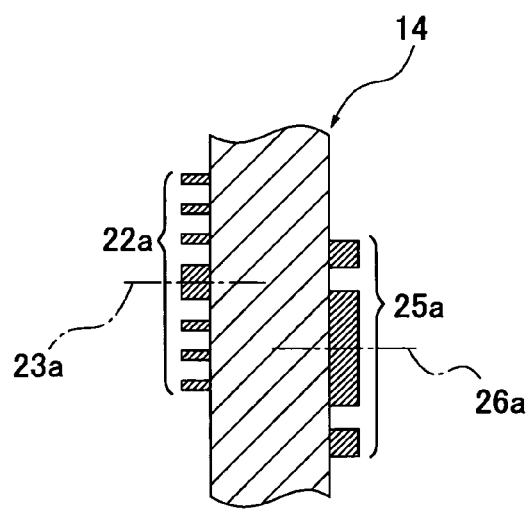
FIG. 2C is a sectional view illustrating the low-pass filter.

FIG. 2C is a sectional view illustrating a section of the low-pass filter 14, viewed in a direction shown by arrow A of FIG. 2A. Sectional shapes of the diffracting structures are rectangular and the optical axes 23a, 26a of the diffracting areas are disposed so as to slightly deviate upwardly or downwardly from each other. Effective diameters of the diffracting areas 22a and 25a differ from each other and modulated degrees of the pitches and groove depths of the diffracting areas 22a and 25a are also different from each other. By use of the shapes of the one end surface and the other end surface of the low-pass filter 14 differing from each other, light beams transmitting the areas 21a, 21b, . . . and the areas 24a, 24b, . . . are focused on different two point on the light-receiving surface 15b of the imaging element body 15, depending on the wavelengths of the light beams.

As a method for producing the low-pass filter, a method applying a photolithographic technology or a method using precision cutting process with, for example, a diamond bite, may be used. The low-pass filter may be produced by forming a pattern in a die having a shape and performing an injection moulding or a so-called 2P method with a transparent material to copy a plurality of diffracting optical elements.

[One End Surface of the Low-Pass Filter, Disposed at the Side Close to the Lens System]

Figure 3A:
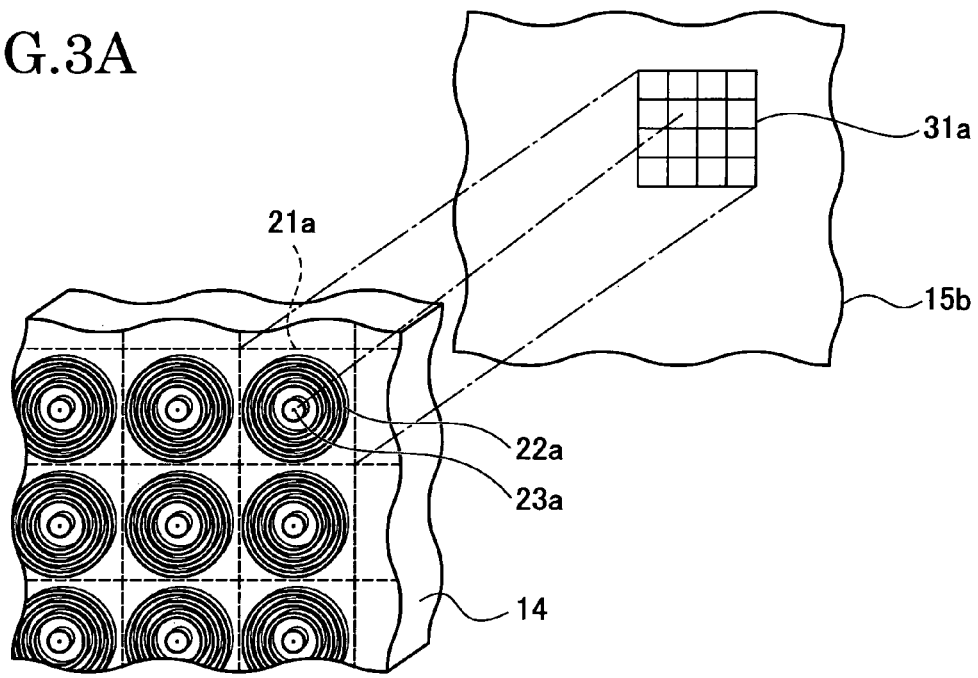
FIG. 3A is an explanatory view illustrating a case where light having wavelengths of 450 nm and 550 nm enters the low-pass filter on a diffracting surface of the low-pass filter at a side of a lens.
Figure 3B:
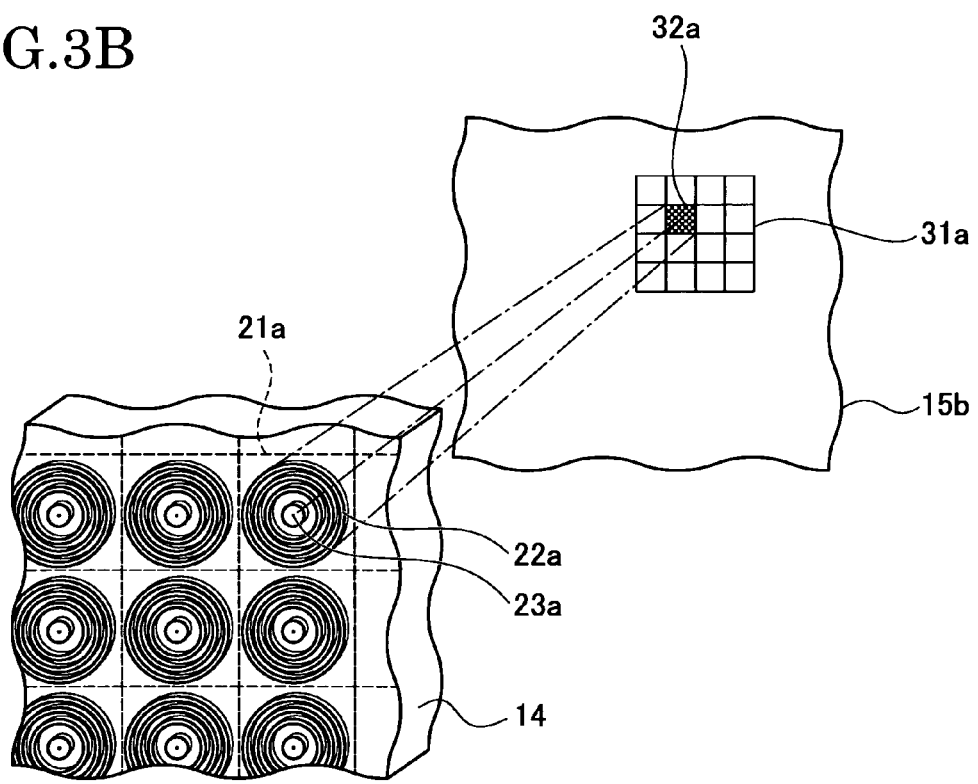
FIG. 3B is an explanatory view illustrating a case where light having wavelength of 650 nm enters the low-pass filter on the diffracting surface of the low-pass filter at the side of the lens.

The diffracting areas 22a, 22b, . . . of the one end surface of the opposites surface of the low-pass filter 14, which is disposed at the side close to the lens system 13 have a function as a spatial low-pass filter for a light beam having a wavelength of 650 nm. Here, the area 21a will be explained as a representative example. As shown in FIG. 3A, the diffracting area 22a formed in the area 21a is configured to emit a 0-order diffraction light when light having a wavelength of 450 nm or 550 nm enters the diffraction area 22a of the low-pass filter, that is, the diffracting area 22a is configured to transmit the light as a dead zone transmission and focus the transmitting light on a light-receiving area 31a as a part of the light-receiving part 15b of the imaging element body 15. The light-receiving area 31a corresponds to an area having 16 pixels. On the other hand, when light having a wavelength of 650 nm enter the low-pass filter, as shown in FIG. 3B, the light is emitted as a first diffraction light and focused on one pixel 32a on the light-receiving part 15b. Accordingly, the one end surface of the low-pass filter 14 is configured to function as a mere transmitting element for the light having the wavelengths of 450 nm and 550 nm and function as a diffracting element for the light having the wavelength of 650 nm.

[Groove Depth of the Diffracting Area 22a, or the Like]

Figure 4:
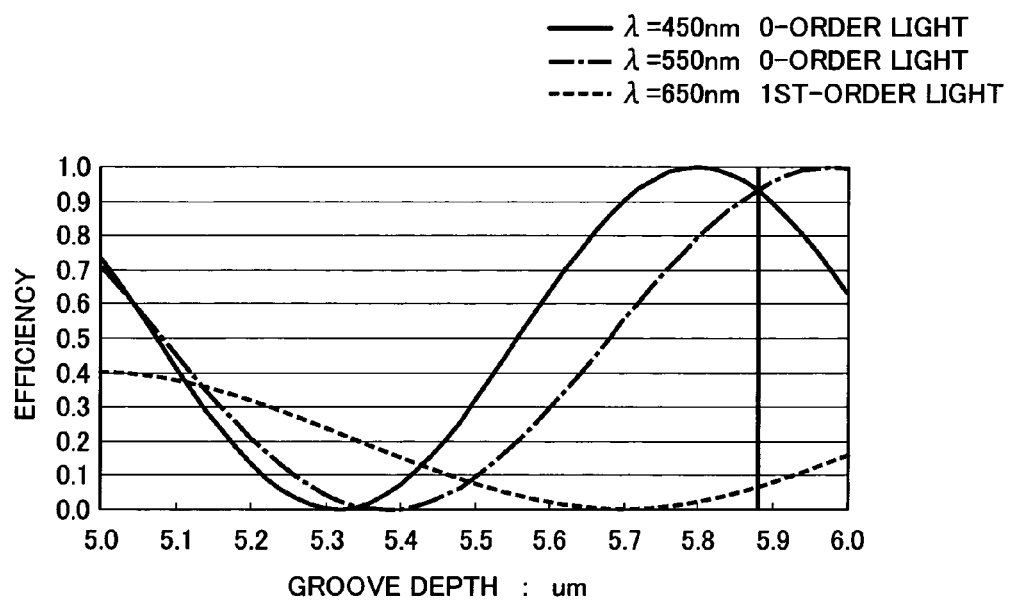
FIG. 4 is a view illustrating a relationship between a 0-order light transmissivity or a first order light diffraction efficiency and a groove depth of concave-convex shapes on the diffracting surface of the low-pass filter at the side of the lens.

The above-described wavelength selectivity can be achieved by selecting a groove depth of the diffracting structures. By setting a periodic phase difference of concave-convex shapes in section of a diffracting grating to be 2n times (multiples of two) of a predetermined wavelength (for example, 450 nm, 550 nm) of a predetermined light which is desired to be selectively transmitted by the low-pass filter, a high 0-order light transmissivity can be achieved for the light having the wavelengths of 450 nm and 550 nm. FIG. 4 is a view illustrating a relationship between the 0-order light transmissivity or the first order light diffraction efficiency of the diffracting grating having the sectional concave-convex shapes and the groove depth of the concave-convex shapes for the wavelengths of 450 nm, 550 nm, and 650 nm. Material for the used diffracting grating is quartz having a refractive index of 1.45.

As seen in FIG. 4, at the depth of about 5.88 µm, the 0-order light transmissivity for the wavelength of 450 nm and 550 nm is 90% or more and the first order light diffraction efficiency for the wavelength of 650 nm is about 6%. For example, by setting the groove depth of the diffracting area 22a to be in the above-described condition, the light having the average (the light transmissivity of 6% per pixel for 16 pixels, that is, the light transmissivity of 96%) of the wavelength of 650 nm, transmitting the area 21a is focused on the pixel 32a shown in FIG. 3B. On the other hand, the light of 450 nm, 550 nm, and 650 nm are substantially uniformly received by the pixels of the light-receiving part 31a other than the pixel 32a.

[Other End Surface of the Low-Pass Filter, which is Disposed at a Side Close to the Imaging Element Body]

Figure 5A:
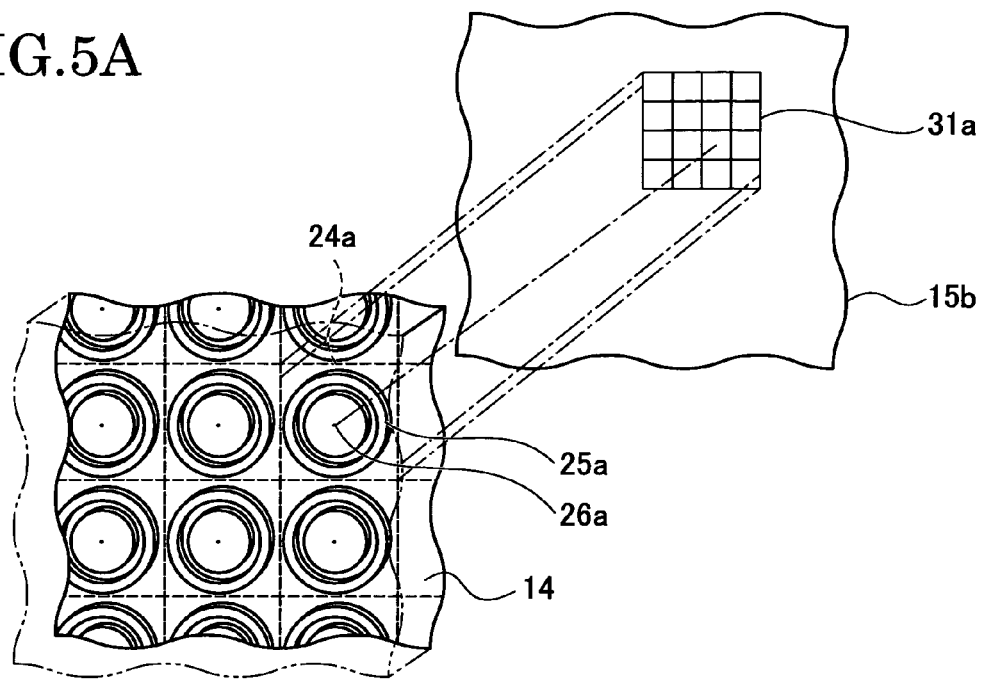
FIG. 5A is an explanatory view illustrating a case where the light having the wavelengths of 450 nm and 550 nm enters the low-pass filter on a diffracting surface of the low-pass filter at a side of an imaging element body.
Figure 5B:
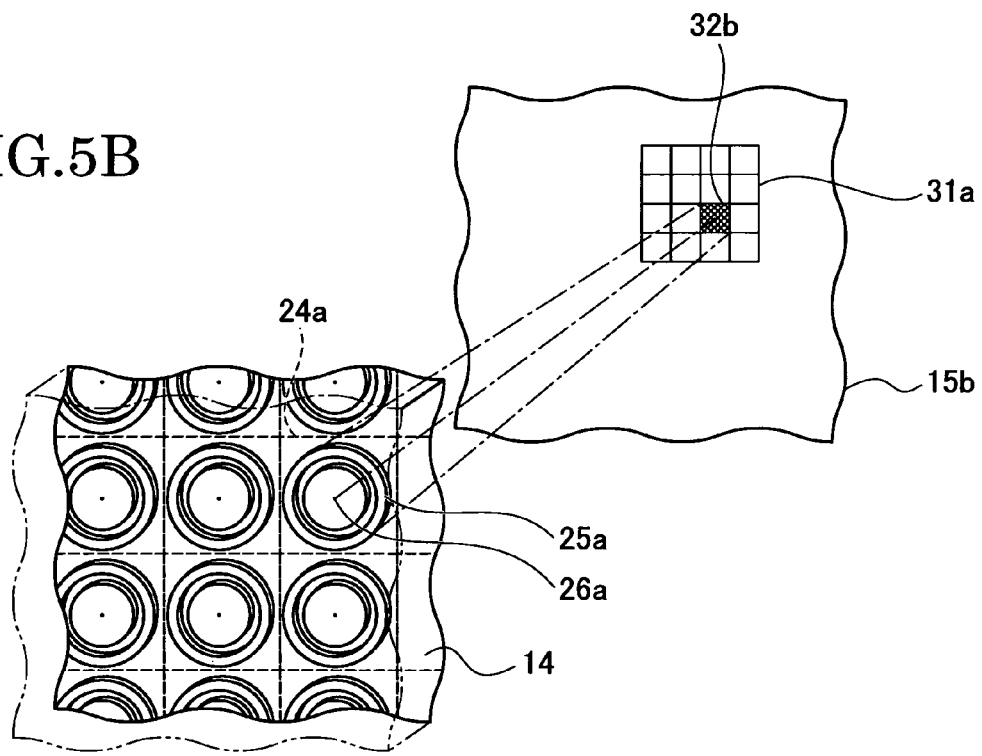
FIG. 5B is an explanatory view illustrating a case where the light having the wavelength of 650 nm enters the low-pass filter on the diffracting surface of the low-pass filter at the side of the imaging element body.

The other end surface of the low-pass filter 14, which is disposed at a side close to the imaging element body has the diffracting areas 25a, 25b, . . . Each diffracting area 25a, 25b, . . . functions as a spatial low-pass filter, mainly for the light having the wavelength 550 nm. Here the area 24a will be explained as a representative example. The diffracting area 25a formed in the area 24a is, as shown in FIG. 5A, configured to emit substantially a 0-order diffraction light when the light having the wavelength of 450 nm and 650 nm enter the diffracting area 35a, that is, the diffracting area 25a transmits the light having the wavelengths of 450 nm and 650 nm as a dead zone transmission and focuses the transmitting light on the light-receiving area 31a of a part of the light-receiving part 15b of the imaging element body 15. The light-receiving area 31a corresponds to an area of 16 pixels. On the other hand, when the light having the wavelength of 550 nm enters the low-pass filter 14, as shown in FIG. 5B, the first order diffraction light is focused on one pixel 32b on the light-receiving part 15b of the imaging element body. Accordingly, the other end of the low-pass filter 14 is configured to function as a mere transmitting element for the light having the wavelengths of 450 nm and 650 nm and function as a diffracting element for the light having the wavelength of 550 nm. In this embodiment, the optical axis 26a of the diffracting area 25a is positioned so as to obliquely deviate by one pixel in a focused position from the optical axis 23a of the diffracting area 22a

[Groove Depth of the Diffracting Area 25a, or the Like]

Figure 6:
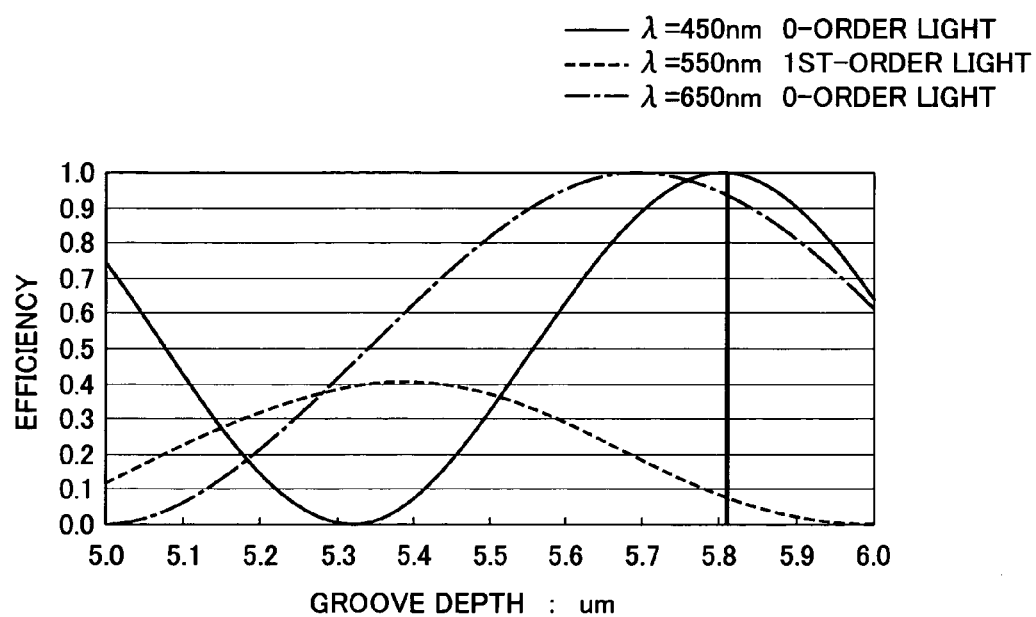
FIG. 6 is a view illustrating a relationship between a 0-order light transmissivity or a first order light diffraction efficiency and a groove depth of concave-convex shapes on the diffracting surface of the low-pass filter at the side of the imaging element body.

The above-described wavelength selectivity can be achieved by selecting a groove depth of the diffracting structures. By setting a periodic phase difference of concave-convex shapes in section of a diffracting grating to be 2n times (multiples of two) of a predetermined wavelength (for example, 450 nm, 650 nm) of a predetermined light, which is desired to be selectively transmitted by the low-pass filter, a high 0-order light transmissivity can be achieved for the light having the wavelengths of 450 nm and 650 nm. FIG. 6 is a view illustrating a relationship between the 0-order light transmissivity or the first order light diffraction efficiency of the diffracting grating having the sectional concave-convex shapes and the groove depth of the concave-convex shapes for the wavelengths of 450 nm, 550 nm, and 650 nm. Material for the used diffracting grating is quartz having a refractive index of 1.45.

As seen in FIG. 6, at the depth of about 5.81 μm, the 0-order light transmissivity for the wavelength of 450 nm and 650 nm is 90% or more and the first order light diffraction efficiency for the wavelength of 550 nm is about 7%. For example, by setting the groove depth of the diffracting area 25*a* to be in the above-described condition, the light having the average (the light transmissivity of 7% per pixel for 16 pixels, that is, the light transmissivity of about 100%) of the wavelength of 550 nm, transmitting the area 25*a* is focused on the pixel 32*b* shown in FIG. 5B. On the other hand, the light of 450 nm, 550 nm, and 650 nm are substantially uniformly received by the pixels of the light-receiving part 31*a* other than the pixel 32*b*.

By using the above-described low-pass filter 14 having the wavelength selectivity within the optical system, for example, of the light transmitting the areas 21*a* and 24*a* of the front and rear surfaces of the low-pass filter, the light having the wavelength of 650 nm is focused on the pixel 32*a* on the light receiving area 31*a* of the imaging element body 15 and the light having the wavelength of 550 nm is focused on the pixel 32*b*. The light beams having the wavelengths 450 nm, 550 nm, and 650 nm uniformly enter the pixels other than the pixels 32*a* and 32*b*. Under such a receiving state, an color image can be formed from a monochrome image by the reconstruction processes described below with reference to, for example, FIGS. 8 to 11.

In this embodiment, the three wavelengths of 450 nm, 550 nm, and 650 nm are used but the wavelengths are not limited thereto. For example, a combination of wavelengths of 470 nm, 520 nm, and 600 nm can be used. Furthermore, a case where each wavelength does not have one value, that is, may have a bandwidth, for example, of about 20 nm. The combination of wavelengths can have further a near-infrared wavelength band, for example, about 850 nm in addition to the three wavelengths.

Each area 21*a*, 21*b*, 24*a*, 24*b* and each diffracting area 22*a*, 22*b*, 25*a*, 25*b* may have a size variation (corresponding to a number of pixels) depending on a position thereof. That is, the sizes of the areas 21*a*, 21*b*, 24*a*, and 24*b* may be varied depending on the positions from a center of an optical axis of an imaging lens or the aperture stop to a peripheral area (an area out of the optical axis).

Although, as the sectional shape of the diffracting grating, the rectangular shape in section is described in this embodiment, the sectional shape of the diffracting grating may have a stepped structure. Furthermore, the diffraction order is not limited to the 0-order light and the first diffraction light and a second order light or a higher order light may be used. Moreover, the optical axes 23*a*, 26*a*, 23*b*, and 26*b* of the diffracting areas of the front and rear side surfaces of the low-pass filter may be coaxial. In this case, the focusing positions of the diffracting areas 22*a*, 25*a* and the diffracting areas 22*b*, 25*b* are set to deviate from each other in a phase difference function. Furthermore, although the case where the low-pass filter 14 has two end surfaces each having the diffracting structure is described in this embodiment, the diffracting structure may be formed on only one end surface. In this case, the wavelength selectivity can be achieved by use of a difference in the diffraction order, that is, it can be achieved, for example, when the light having the wavelength of 650 nm is focused on a pixel as a +first order light and the light having the wavelength of 550 nm is focused as a −first order light on a pixel different from the pixel where the +first order light is focused.

The structure of the diffracting area is not limited to the concentric circular pattern and a liner pattern may be used. In this case, the diffraction light is focused on the imaging element body not as a point but a line and therefore, the image reconstruction can be achieved according to the liner pattern.

In addition, although the case where the low-pass filter 14 is disposed separately from the imaging element body and between the lens system 13 and the imaging element body 15 is described, it is not limited thereto. For example, as a substitute for the cover glass 15*a* of the imaging element body 15, the low-pass filter may be used. Thereby, a number of parts can be reduced. Alternatively, the low-pass filter may be formed on a lens surface of the lens system 13. Moreover, the low-pass filter may be formed integrally with the light-receiving part 15*b*. In this case, positional misalignment of the imaging element body or the like can be reduced to achieve a stable property.

Figure 7:
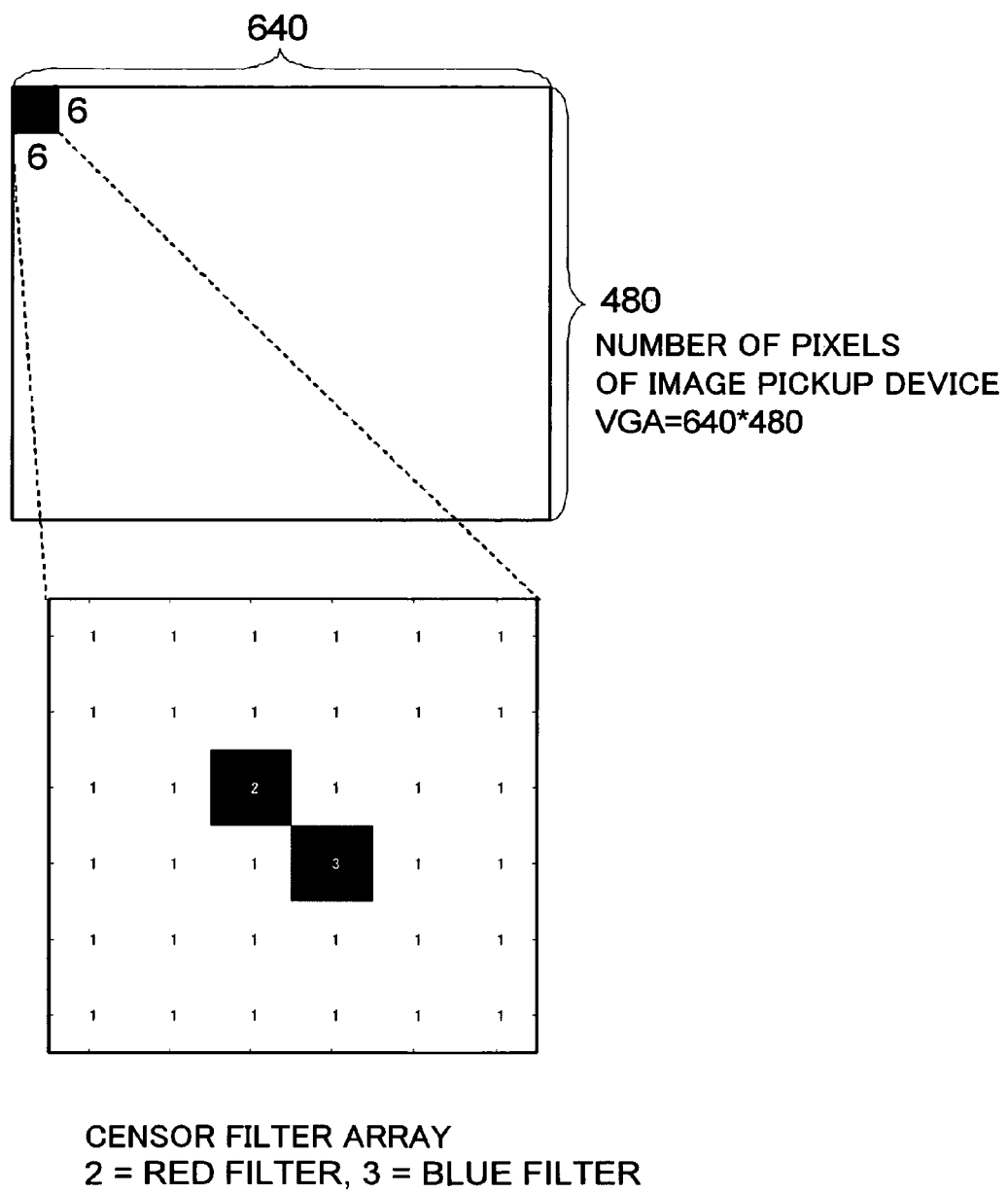
FIG. 7 is an explanatory view explaining a structure of a filter array having a period of 6×6.

Hereinafter, a structure of a filter array of the imaging element will be explained. As shown in FIG. 7, every array period of 6×6 has a pixel having a function of extracting a wavelength component of red light and a pixel having a function of extracting a wavelength component of blue light, which are disposed at a center of the array period. Here, the pixel having the function of extracting the wavelength component of red light is referred to as the red filter, and the pixel having the function of extracting the wavelength component of blue light is referred to as the blue filter. However, it is not only limited to the case where there is an actual filter to transmit only the wavelength component, but also the case where the above-described diffracting element is used as a filter. In the filter array of FIG. 7, color filter arrays are continuously disposed at a 6×6 pixel period.

The pixels of the imaging element may be divided into a plurality of periods each having an anomalous pixel. The filter array may have an LPF characteristic such that a light amount of a light beam focused on the anomalous pixel configured to extract a predetermined wavelength component is larger than an average light amount of light beams of the predetermined wavelength component focused on pixels adjacent to the anomalous pixel entering within one period of the pixels of the imaging element.

The pixels other than the pixels of the red and blue filters do not have a filter function but are configured to obtain brightness information and therefore are referred to as Y pixels hereinafter. The important point is that the R (red) pixel of the red filter and the B (blue) pixel of the blue filter have a spatial LPF effect. Therefore, an average value of an intensity of red light entering the array of the 6×6 and an average value of an average value of an intensity of blue light entering of the 6×6 can be obtained by the red pixel and the blue pixel, respectively. In a case where there is no LPF (low-pass filter) effect, even when performing the following processes, a remarkably large aliasing noise occurs in color signals and therefore an image quality is largely degraded.

Figure 8:
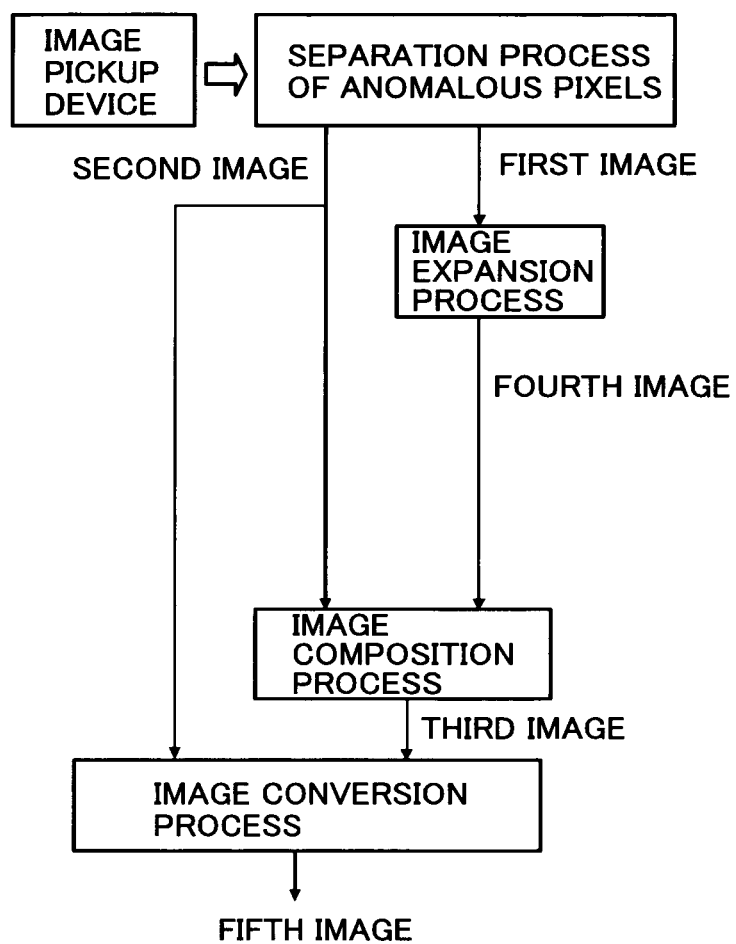
FIG. 8 is a view illustrating a flow to process an image imaged by an imaging element.

The pixels having filter functions is provided with the spatial LPF effect and composing process is performed under the consideration of the spatial LPF effect so that the above-described problems can be solved. The process in this case is shown in FIG. 8.

The above-described control device may be configured to perform a separation process to separate the subject image formed by the imaging element into a first image formed by the predetermined pixels and a second image formed by the other pixels. The first image may be an image regarding color information and the second image may be an image regarding brightness information.

The control device may be configured to perform an image expansion process to generate a fourth image by expanding the first image and an image composition process to compose the second and fourth images to form a third image in addition to the separation process.

The control device may be configured to perform an image conversion process to convert color information of the second and third images into brightness information and to form a fifth image having brightness values of RGB in addition to the image expansion process and the image composition process.

The control device may be configured to perform an image expansion process to expand the first image to form a fourth image, an LPF process to apply an LPF processing to the first image to form a sixth image by removing high frequency component from the first image, and an image composition process to compose the fourth and sixth images to form a third image in addition to the separation process.

The control device may be configured to perform an image conversion process to convert color information of the second and third images into brightness information to form a fifth image having brightness values of RGB in addition to the image expansion process, the LPF process and the image composition process. The LPF process may be a process to average brightness values of pixels within a small range in relation to a period in which the predetermined pixels are arranged. The LPF process may include an image reduction process and an image expansion process. The third image may be an image relating to color information.

At first, a separation process is performed. In the separation process, signals from the imaging element are separated into a second image formed by Y pixels and a first image formed by R pixels and B pixels. At this time, failure parts in the second image formed by the Y pixels are interpolated by peripheral Y pixels before the following image composition process and the second image has a same size (a number of pixels) as the imaging element. Then, an image expansion process is performed to expand the first image formed by the R pixels and B pixels such that the first image has a same size as the second image and then the image composition process is performed to generate Cb, Cr (color-difference) signals to form a third image.

Next, an image conversion process is performed to combine the second and third image and then generate a fifth image. In the image conversion process, for example, the following conversion equations are used.

$$Cb\_out = 0.564 \times (B\_in - Y\_in)$$

$$Cr\_out = 0.713 \times (R\_in - Y\_in)$$

where Y_in is input data of the second image, B_in and R_in are input signals of B pixels and R pixels of the fourth image, and Cb_out and Cr_out are output brightness signals and color signals of the third image.

In the image conversion process, the Y (brightness) signals of the second image are combined and by use of signals of the imaging element, which are obtained from the above-described color filter array, a color image obtained from the YCbCr signals of the fifth image can be obtained.

Figure 9:
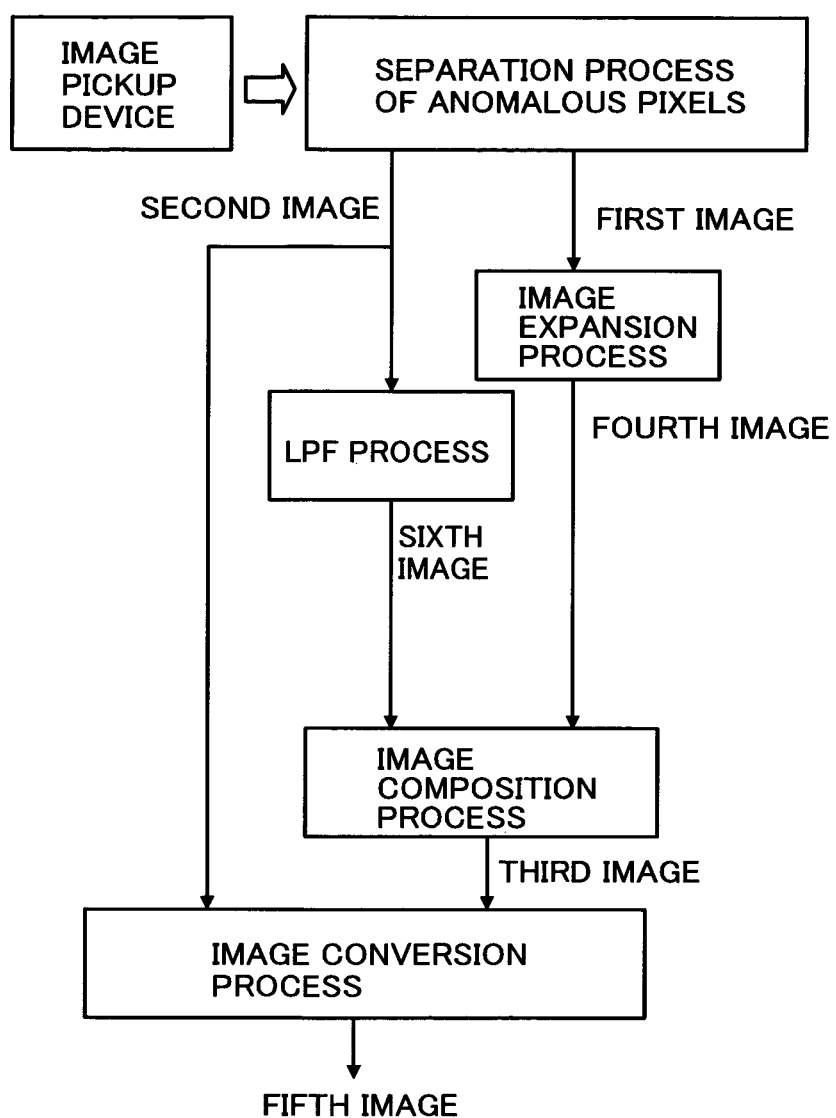
FIG. 9 is a view illustrating a flow to process an image imaged by an imaging element.

Here, the process shown in FIG. 9 may be performed so that high quality image with reduction of aliasing noise can be obtained.

That is, in FIG. 9, an LPF process to apply an LPF processing to the second image to obtain a sixth image is added. Since in this embodiment, the filter array of 6×6 is used, a filter smoothing 6×6 pixels is preferably used for the LPF processing.

Figure 10:
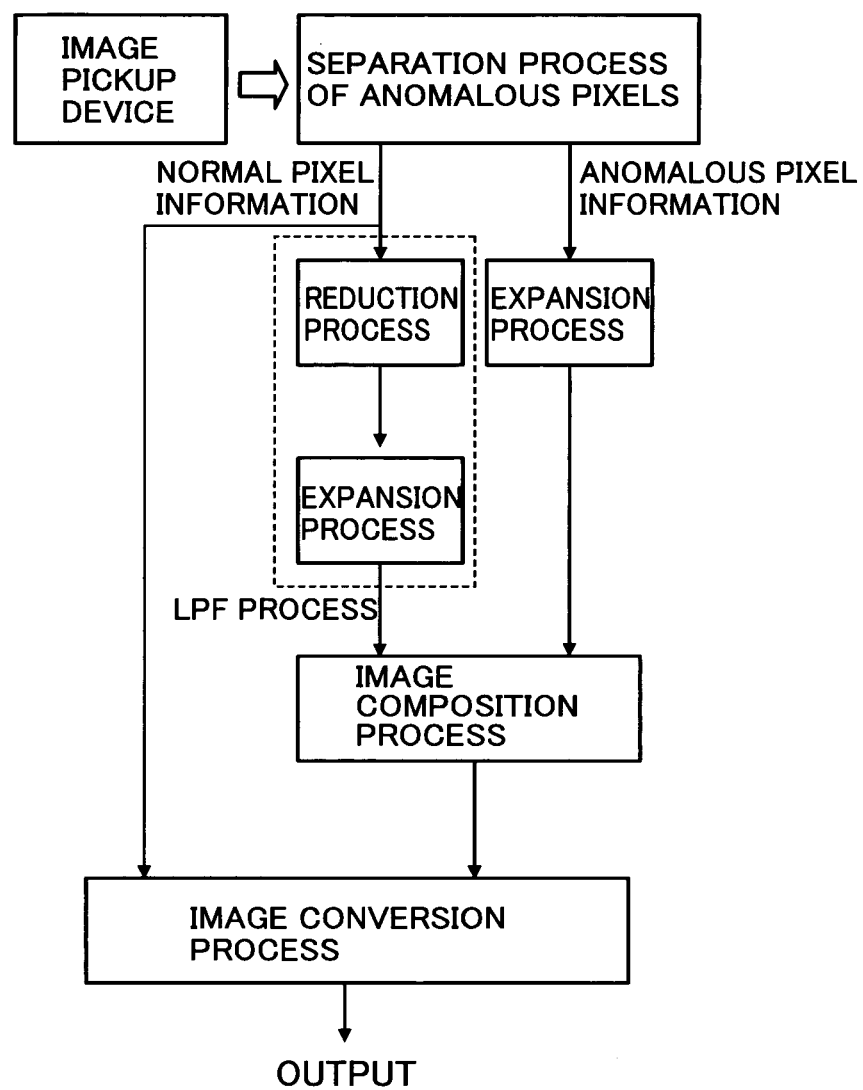
FIG. 10 is a view illustrating a flow to process an image imaged by an imaging element.
Figure 11:
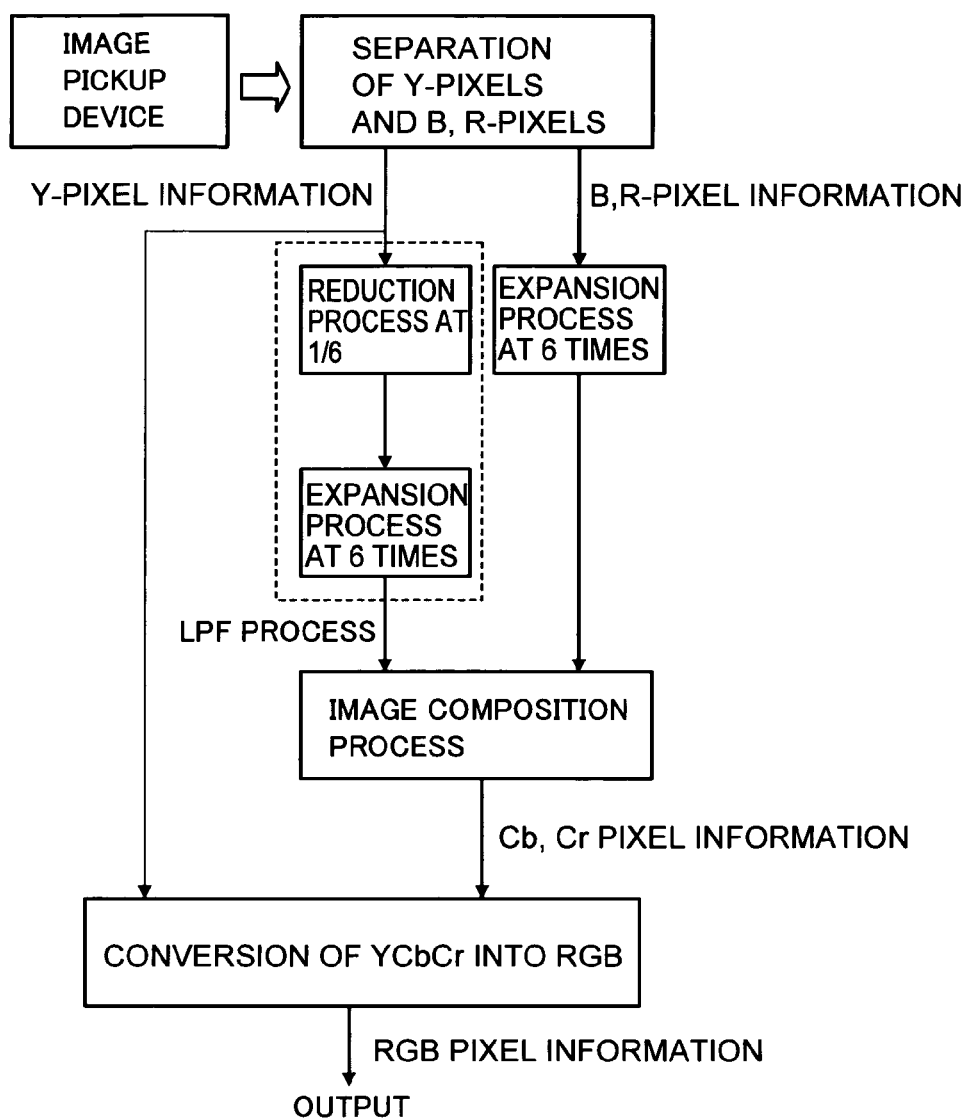
FIG. 11 is a view illustrating a flow to process an image imaged by an imaging element.

As the LPF processing, as shown in FIG. 10, the image expansion process and the image reduction process are used so that high quality image can be achieved. Here, it is preferable that an image size of the reduced image is a same size as the size of the first image (that is, a pixel number of anomalous pixels of the imaging element) and an image size of the expanded image is a same size of the fourth image. FIG. 11 is shown as a specific example of the processes shown in FIG. 10.

Next, different points in quality of the imaged images between a case where a subject image is imaged by use of the imaging element provided with a color filter having a spatial LPF function and a case where a subject image is imaged by use of the imaging element provided with a color filter without a spatial LPF function are explained.

Figure 27A:
FIG. 27A includes an exemplary image imaged by an imaging element in which a color filter having a spatial LPF function is applied.
Figure 27B:
FIG. 27B includes the exemplary image of FIG. 27A in which the color filter does not have the spatial LPF function.

FIG. 27A (referred to as "Photo 1", hereinafter) shows an imaged image in the case where the color filter has the spatial LPF function and FIG. 27B (referred to as "Photo 2", hereinafter) shows an imaged image in the case where the color filter does not have the spatial LPF function.

In the case of Photo 1, there is only small color bleed, high sensitivity can be achieved because most pixels have no color filter, and a high-resolution image can be obtained. On the other hand, in the case of Photo 2, there is large color bleed and resolution of an image is low.

Figure 27C:
FIG. 27C includes the exemplary image imaged by an imaging element using a Bayer arrangement color filter.

For comparison, an imaged image in a case where an imaging element having the conventionally used Bayer arrangement color filter is used is shown in FIG. 27C (referred to as "Photo 3", hereinafter). In Photo 3, especially, as can be seen from parts of characters, the resolution of Photo 3 is less than that of Photo 1.

As can be seen from comparison with Photos 2 and 3, Photo 1 has a higher sensitivity and better resolution.

In the above-described examples, the color filters of R and B are used but other combinations of color filters, for example, of G and B, of R, G, and B, of IR (infrared) and B, and the like may be used.

Figure 28A:
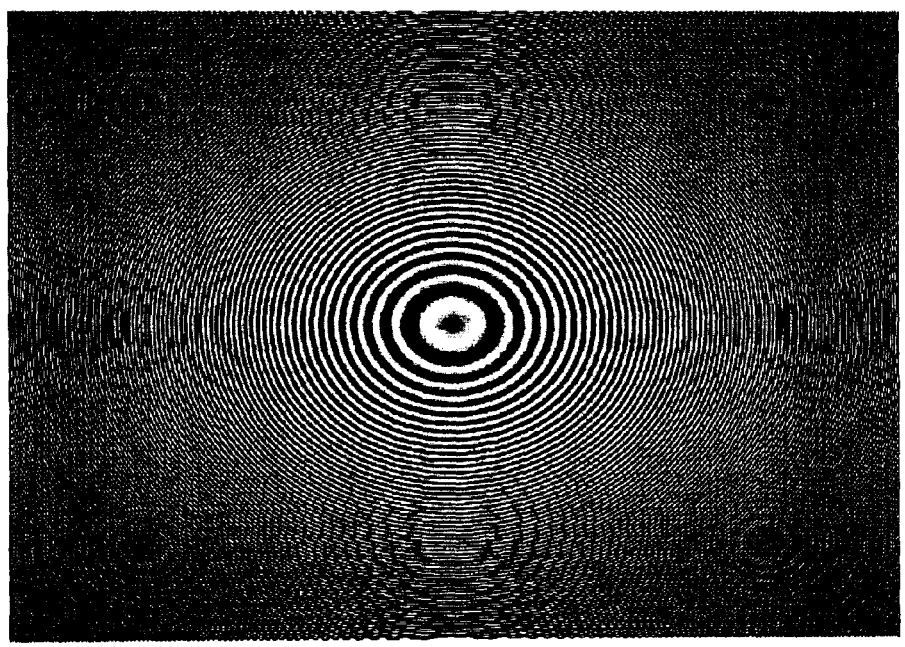
FIG. 28A includes an exemplary image of a Circular Zone Plate (CZP).
Figure 28B:
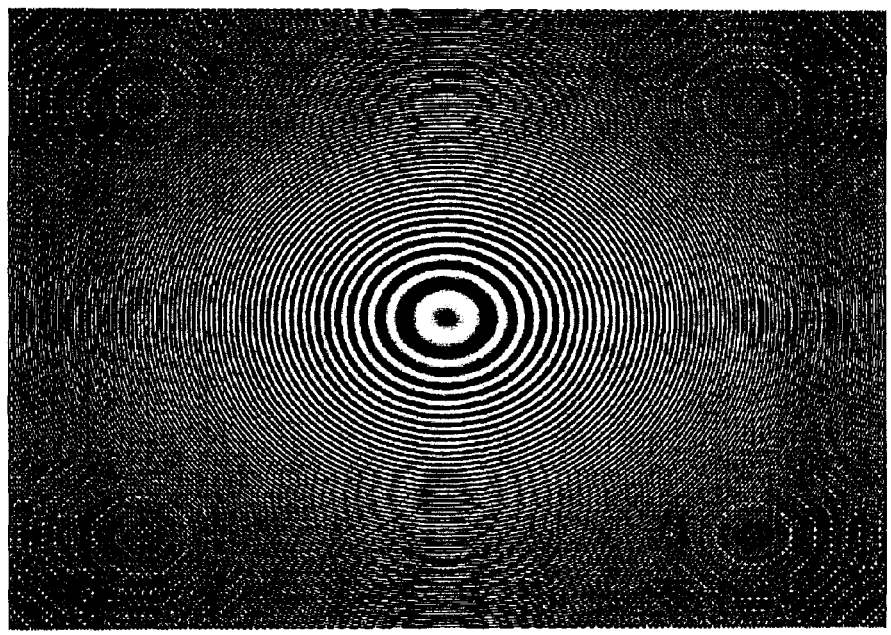
FIG. 28B includes the exemplary image of the CZP in which a color filter with the spatial LPF function is applied.
Figure 28C:
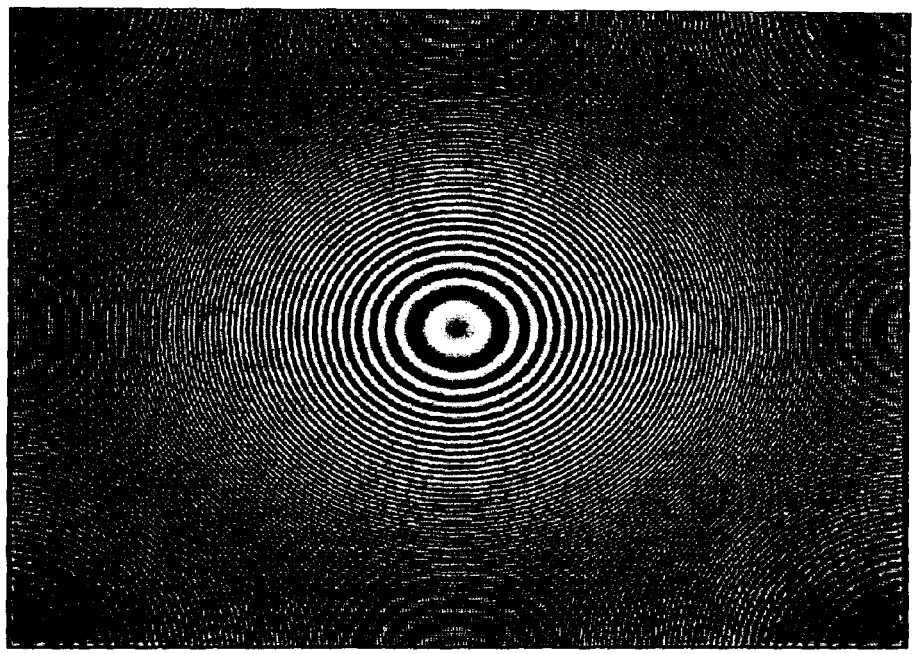
FIG. 28C includes the exemplary image of the CZP imaged by an imaging element using a Bayer arrangement color filter.

Here, for reference, a comparison with a case where a Circular Zone Plate (CZP) is used will be explained by using FIG. 28A (referred to as "Photo 4", hereinafter), FIG. 28B (referred to as "Photo 5", hereinafter), and FIG. 28C (referred to as "Photo 6", hereinafter).

Photo 4 is an input CZP image, Photo 5 is an image imaged by using the imaging element according to this embodiment, that is, the imaging element having the color filter with the spatial LPF function, and Photo 6 is an image imaged by using the imaging element having the Bayer arrangement color filter. In Photo 5, generation of fake color is suppressed and high resolution can be achieved in comparison with Photo 6.

In this embodiment, although the period of the filter array of 6×6 is used to gather 1/36 of an R component of the pixel into the R pixel in the optical LPF, simply, white light has the R component of 1/3 of total light amount. That is, the brightness of the R pixel is 1/3 of the brightness of the Y pixel for a white subject. Accordingly, there is a problem in that S/N of the R pixels are degraded. In order to solve the problem, in the optical LPF, the filter array is preferably configured such that each R component is set to have 3/36, that is, 1/12 to be gathered into the R pixels. The configuration for the B pixels is preferably the same.

It is possible to use a period of the filter array of more than 6×6 in a case where more sensitivity is needed. For example, in a case where the filter array having the period of 16×16 is used, since resolution of the color information is degraded, color bleed is easily generated in an output image.

In this case, in the LPF processing, it can be preferable to perform the reduction process of ⅛ and the expansion process of 8 times, which are factors smaller than the period of the filter array, rather than the reduction process of 1/16 and the expansion process of 16 times.

Figure 29A:
FIG. 29A includes an exemplary image imaging by an imaging element using an LFP processing with a reduction process of 1/16 and an expansion process of 16 times is performed.

A result of the LPF processing where the reduction process of 1/16 and the expansion process of 16 times are performed is shown in FIG. 29A (referred to as "Photo 7", hereinafter).

Figure 29B:
FIG. 29B includes an exemplary image imaging by an imaging element using an LFP processing with a reduction process of 1/8 and an expansion process of 8 times is performed.

A result of the LPF processing where the reduction process of ⅛ and the expansion process of 8 times are performed is shown in FIG. 29B (referred to as "Photo 8", hereinafter).

In the case of Photo 8, reduced color bleed is achieved and high quality image can be obtained in comparison with the case of Photo 7. That is, by performing the LPF processing using factors smaller than the filter array, high quality image can be obtained.

Second Embodiment

The low-pass filter may have a polarization-dependent characteristic changing depending on a polarization direction of the predetermined light.

The polarization-dependent characteristic of the low-pass filter may be a characteristic to transmit only a predetermined polarization light component Next, a second embodiment of the present invention will be explained. Although the wavelength-selective low-pass filter is used in the first embodiment, a polarization-selective low-pass filter is used in this embodiment.

Figure 13:
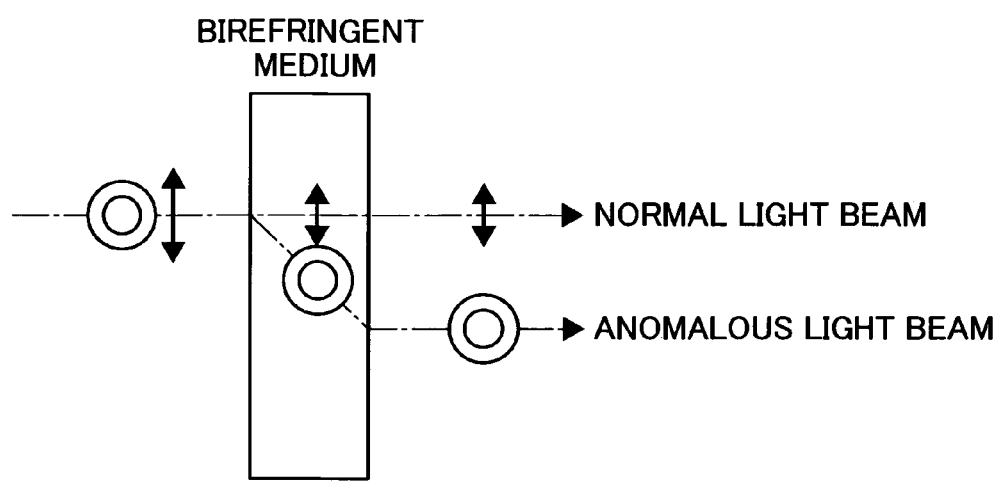
FIG. 13 is a view illustrating paths of light beams when transmitting a birefringent medium.

In this embodiment, as the low-pass filter 14, a diffracting grating having light-polarization selectivity is formed. At first, with reference to FIG. 13, transmissive characteristics of light beams polarized in relation to a birefringent medium will be explained. FIG. 13 is a view illustrating paths of the light beams in a case where the light beams enter and transmit the general birefringent medium. When the light beams enter the birefringent medium, a direction of the light beams is changed depending on polarizations of the light beams. That is, as shown in FIG. 13, the light beam polarized in a direction parallel to a plane of FIG. 13 in relation to the birefringent medium passes through the birefringent medium without change of the direction. The light beam is referred to as an ordinary light beam or a normal light beam. On the other hand, the light beam polarized in a direction perpendicular to the plane of FIG. 13 in relation to the birefringent medium passes through the birefringent medium with changing the direction. The light beam is referred to as an extraordinary light beam or an anomalous light.

[Polarization-Selective Diffracting Grating]

Figure 14A:
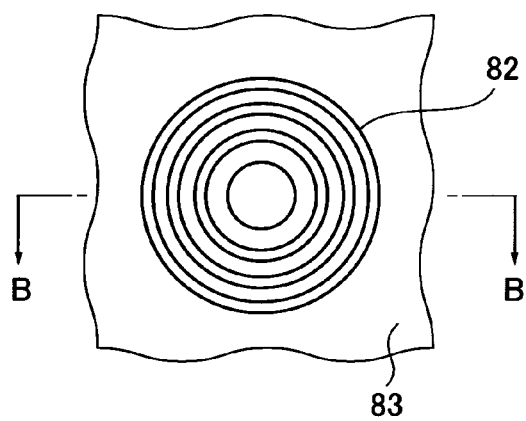
FIG. 14A is a view illustrating a diffracting grating which a light beam enters.

Such a polarization-selective diffracting grating using the birefringent medium will be explained. FIG. 14A is a view illustrating a surface of the diffracting grating, at a side where the light beam enters and FIG. 14B is a sectional view along B-B line of FIG. 14A.

Figure 14B:
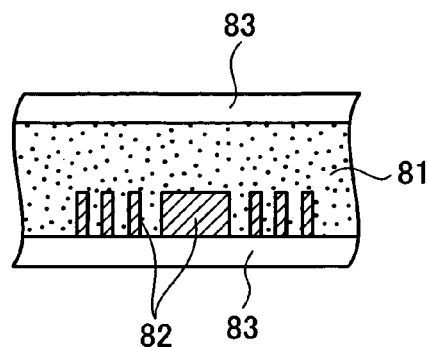
FIG. 14B is a sectional view along B-B line of FIG. 14A.

The diffracting grating shown in FIG. 14B includes an isotropic medium 81, a birefringent medium 82, and glasses 83 disposed so as to sandwich the isotropic medium 81 and the birefringent medium therebetween. The birefringent medium 82 has a plurality of concentric circular bands (see FIG. 14A), and each circular band has a rectangular shape in section. In the sectional view along B-B line of FIG. 14A, the birefringent medium has concave-convex shapes. The isotropic medium 81 has complementary shapes in relation to the shapes of the birefringent medium and is in a contact state with surfaces of the concave-convex shapes of the birefringent medium 82.

Figure 14C:
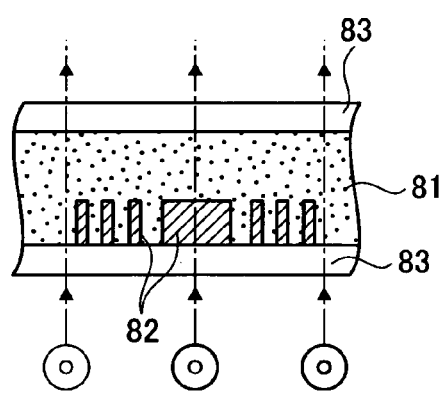
FIG. 14C is a view illustrating a transmitting state according to a polarization direction of a light beam.
Figure 14D:
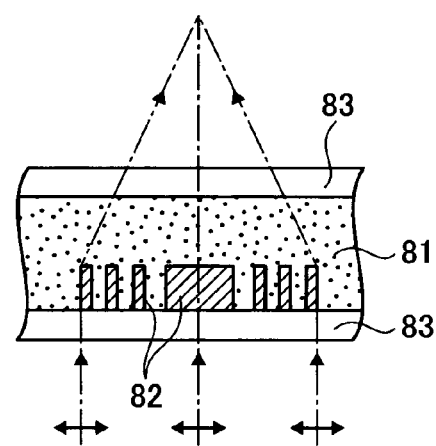
FIG. 14D is a view illustrating a transmitting state according to a polarization direction of a light beam.

With reference to FIGS. 14A and 14B, a light focusing function by use of the polarization-selective diffracting grating will be explained. FIGS. 14C and 14D are views each illustrating a transmitting state of the light beams according to polarization directions of polarized light beams. As shown in FIG. 14B, the birefringent medium 82 has refractive indices of "no" and "ne" depending on the polarization directions of the light beams entering the birefringent medium. Here, no is a refractive index (ordinary refractive index) for the ordinary light beam and ne is a refractive index (extraordinary refractive index) for the extraordinary light beam.

A case where the polarization-selective diffracting grating is produced by selecting the isotropic medium 81 and the birefringent medium 82 so as to set a refractive index n1 of the isotropic medium to be equal to ne will be explained. When the light beam enters the diffracting grating such that the polarization direction of the light beam is equal to the polarization direction of the extraordinary light beam, the refractive index of the isotropic medium 81 is the same as that of the birefringent medium so that the light beam can transmits without any influence. On the other hand, when the light beam enters the diffracting grating such that the polarization direction of the light beam is perpendicular to the polarization direction of the extraordinary light beam, that is, the polarization direction of the light beam is equal to the polarization direction of the ordinary light beam, the refractive indices of the isotropic medium 81 and the birefringent medium are different from each other. Accordingly, the diffraction occurs due to the shapes of boundary surfaces of the isotropic medium and the birefringent medium 82 of the diffracting grating and the direction of the light beam is changed. As shown in FIGS. 14C and 14D, the dead zone transmission or the light focusing is selected depending on the polarization of the entering light beam.

[Low-Pass Filter 14]

Figure 15:
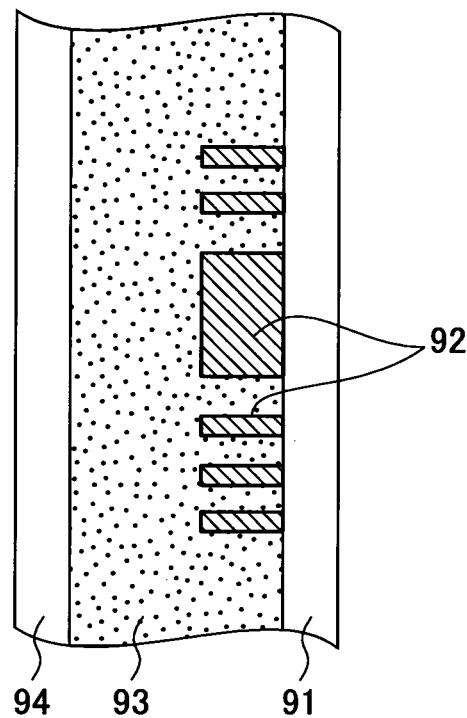
FIG. 15 is a sectional view illustrating a low-pass filter of the second embodiment.

The low-pass filter 14 according to this embodiment has the above-described configuration and function of the polarization-selective diffracting grating. That is, the low-pass filter 14 has a sectional structure shown in FIG. 15, in which diffracting structures 92 are formed on a glass plate or a resin substrate 91 by use of the birefringent medium. An isotropic medium 93 are complementarily added and the diffracting grating is sealed with a glass plate or a resin substrate 94. The light beam enters the sealing glass plate 94.

Figure 16:
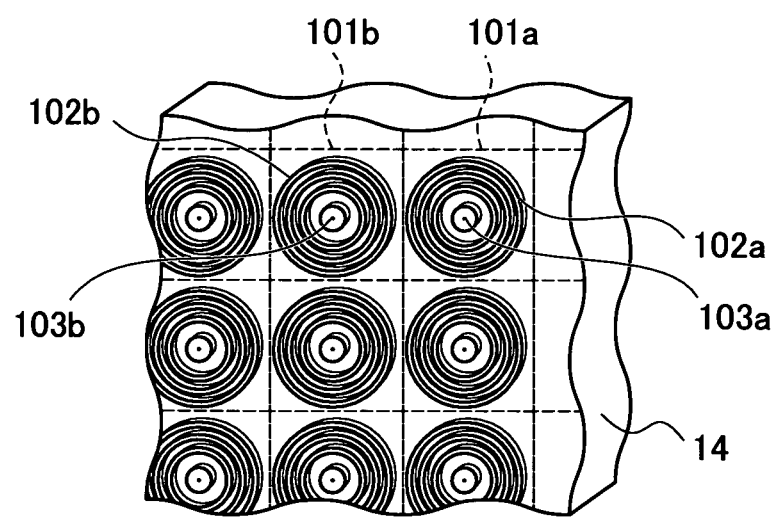
FIG. 16 is a perspective view of the low-pass filter.

FIG. 16 is a perspective view illustrating an end portion of the low-pass filter 14, viewed from a side of the lens systems. In this drawing, for sake of simplicity, the glass plate 94 and the isotropic medium 93 are omitted. The low-pass filter 14 is divided into a plurality of areas 101a, 101b, . . . each having a same area. Each area 101a, 101b, . . . is configured to focus light transmitting the low-pass filter 14 on a plurality of pixels, for example, 4 pixels×4 pixels=16 pixels, of the light-receiving part.

In each area 101a, 101b, . . . , a concentric circular diffracting area 102a, 102b, . . . is formed. The diffracting area 102a is formed by a plurality of concentric circular bands about an optical axis 103a as a center, and the diffracting area 102b is formed by a plurality of concentric circular bands about an optical axis 103b as a center. A pitch (an interval) between the circular bands varies from a center part to a peripheral part to modulate the pitches between the circular bands. According to such a modulation, the diffracting areas can have a lens function. Light-focusing capability becomes higher with decreasing the pitch or the interval between the circular bands.

As a method for producing the low-pass filter 14, a method applying a photolithographic technology or a method using precision cutting process with, for example, a diamond bite, may be used. The low-pass filter may be produced by forming a pattern in a die and performing an injection moulding or a so-called 2P method with a transparent material to copy a plurality of diffracting optical elements.

[Diffracting Area of the Low-Pass Filter]

Figure 17A:
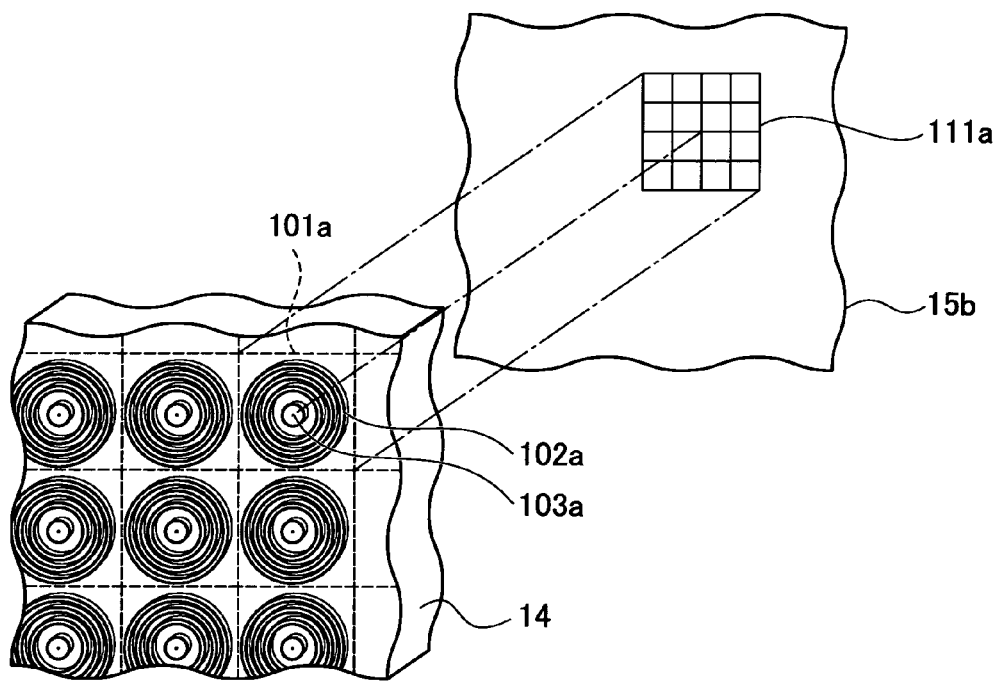
FIG. 17A is an explanatory view explaining a state where an extraordinary light beam enters the low-pass filter.
Figure 17B:
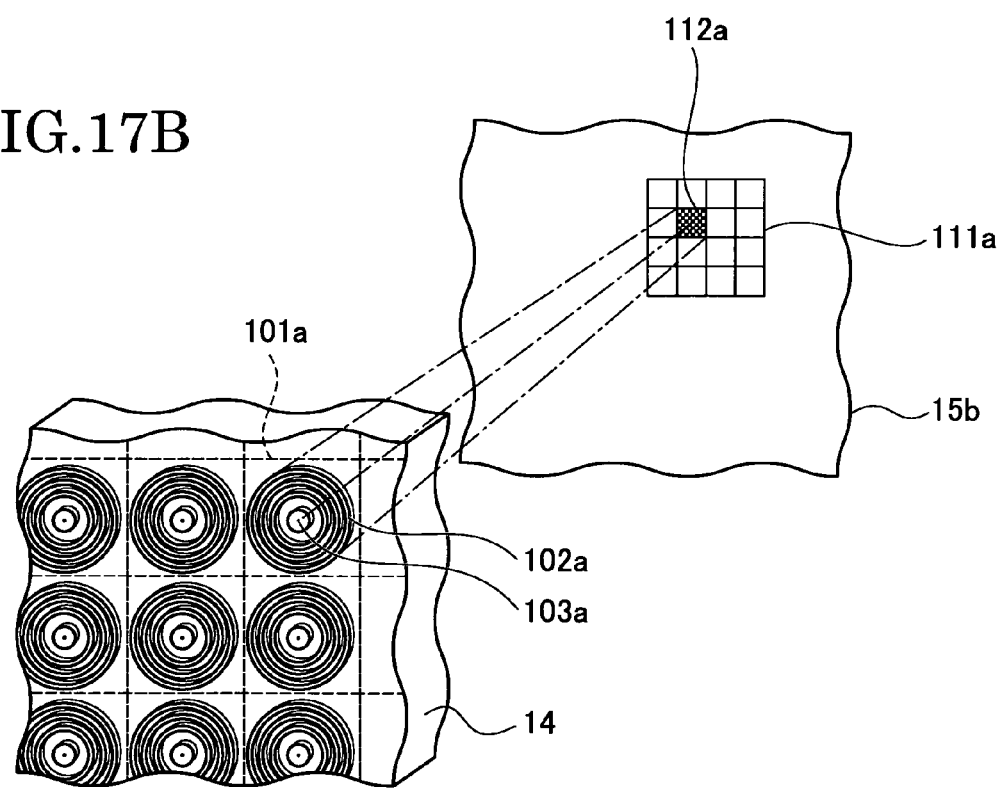
FIG. 17B is an explanatory view explaining a state where an ordinary light beam enters the low-pass filter.

The diffracting areas 102*a*, 102*b*, . . . of the low-pass filter 14 have mainly a function as a spatial low-pass filter for a light beam having a polarization direction of an ordinary light. Here, the area 101*a* will be explained as a representative example. As shown in FIG. 17A, the diffracting area 102*a* formed in the area 101*a* is configured to emit substantially a 0-order diffraction light when light having a polarization direction of the extraordinary light beam enters the diffraction area 102*a* of the low-pass filter, that is, the diffracting area 102*a* is configured to transmit the light as a dead zone transmission and focus the transmitting light on a light-receiving area 111*a* as a part of the light-receiving part 15*b* of the imaging element body 15 (see FIG. 1). The light-receiving area 111*a* corresponds to an area having 16 pixels. On the other hand, when the ordinary light beam enters the low-pass filter, as shown in FIG. 17B, the light beam is emitted as a first diffraction light and focused on one pixel 112*a* on the light-receiving part 15*b*. Accordingly, the low-pass filter 14 is configured to function as a mere transmitting element for the extraordinary light beam and function as a diffracting element for the ordinary light beam.

[Groove Depth of the Diffracting Area 25*a*]

The above-described polarization-selectivity can be achieved by selecting a groove depth of the diffracting structures, the refractive index no of the ordinary light beam, the refractive index ne for the ordinary light beam, and the refractive index n1 for the isotropic medium. By selecting the refractive indices ne and n1 so as to be ne=n1, the dead zone transmission for the extraordinary light beam can be achieved.

Figure 18:
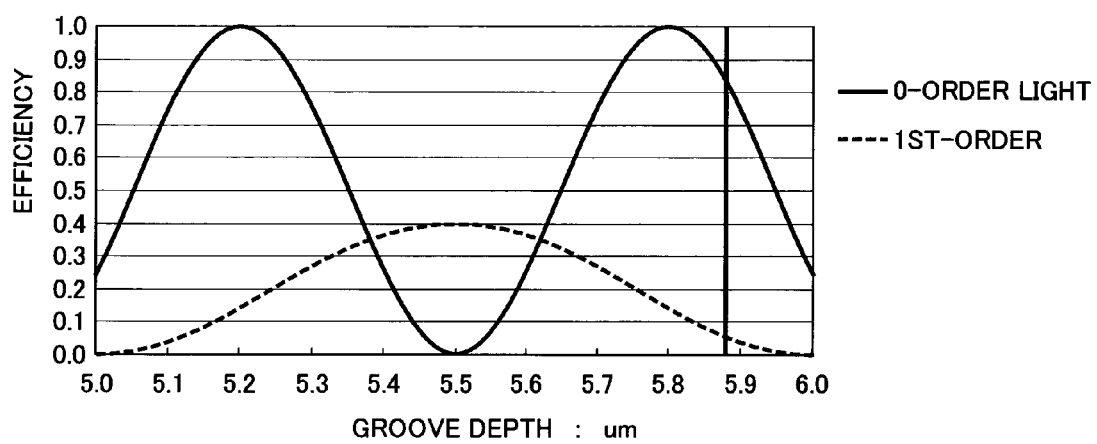
FIG. 18 is a view illustrating a relationship between a 0-order light transmissivity or a first order light diffraction efficiency of the ordinary light beam and a groove depth of concave-convex shapes on the diffracting surface of the low-pass filter at the side of the imaging element body.

FIG. 18 is a view illustrating a relationship between the 0-order light transmissivity or the first order light diffraction efficiency for the ordinary light beam of the diffracting grating having sectional concave-convex shapes and the groove depth of the concave-convex shapes. The refractive indices are no=1.75 and ne=1.45.

At the depth of about 1.86 μm, the 0-order light transmissivity is 90% or more and the first order light diffraction efficiency is about 7%. For example, by setting the groove depth of the diffracting area to be in the above-described condition, the ordinary light beam is focused only on the pixel 112*a* of FIG. 17B and the light having the average of the ordinary light passing through the area 111*a*. On the other hand, the ordinary light beam and the extraordinary light beam are substantially uniformly received by the pixels of the light-receiving part 121*a* other than the pixel 112*a*.

By using the above-described low-pass filter 14 having the polarization-selectivity, for example, the light passing through the area 101*a* of the low-pass filter 14 is focused on the pixel 112*a* of the light-receiving area 11*a* of the imaging element body 15 as the ordinary light beam. On the other pixels, the light of the extraordinary light beam is uniformly focused. By such a light receiving or focusing state, the polarized image can be formed by using a monochrome imaging in the above-described reconstruction process with reference to FIGS. 8 to 11.

Figure 19:
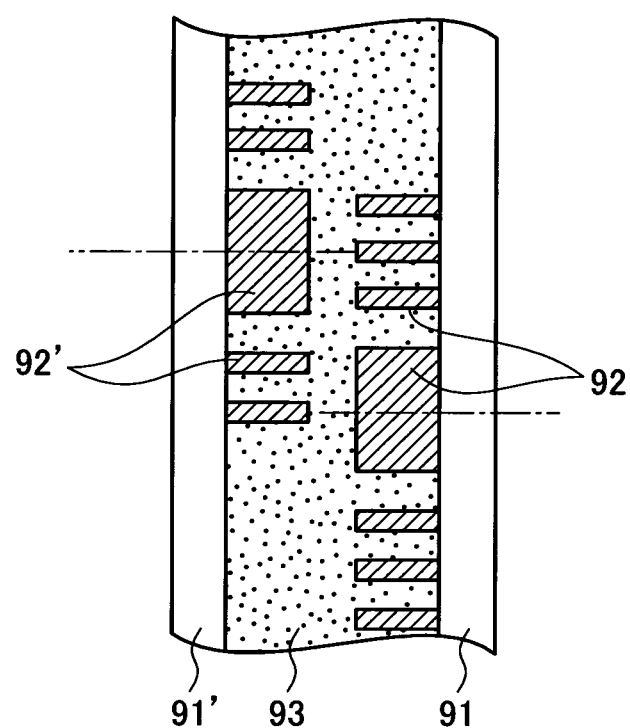
FIG. 19 is a sectional view illustrating a low-pass filter where diffracting structures are oppositely disposed.

In this embodiment, although the case where the diffraction structure is formed at one side, the diffraction structure may be formed at two sides. That is, as shown in FIG. 19, in addition to the plate 91 where the diffraction structure 92 of the birefringent medium is formed, the low-pass filter may have a plate 91' where a diffraction structure 92' is formed at an opposite side of the plate 91 and an isotropic medium 93 is added therebetween. Furthermore, as described in the first embodiment, it is possible to set each diffracting surfaces such that a focusing position of each diffracting surface deviate from each other and the ordinary light beam and the extraordinary light beams are separately focused.

Each area may have a size variation (corresponding to a number of pixels) depending on a position thereof. That is, the sizes of the areas 101*a* may be varied depending on the positions from a center of an optical axis of an imaging lens or the aperture stop to a peripheral area (an area out of the optical axis).

Although, as the sectional shape of the diffracting grating, the rectangular shape in section is described in this embodiment, the sectional shape of the diffracting grating may have a stepped structure. Furthermore, the diffraction order is not limited to the 0-order light and the first diffraction light and a second order light or a higher order light may be used.

The structure of the diffracting area is not limited to the concentric circular pattern and a liner pattern may be used. In this case, the diffraction light is focused on the imaging element body not as a point but a line and therefore, the image reconstruction can be achieved according to the liner pattern.

Although the low-pass filter 14 is disposed separately from the imaging element body 15 between the lens system 13 and the imaging element body 15 in this embodiment, it is not limited thereto. For example, as a substitute for the cover glass 15*a* of the imaging element body 15, the low-pass filter may be used.

Figure 20:
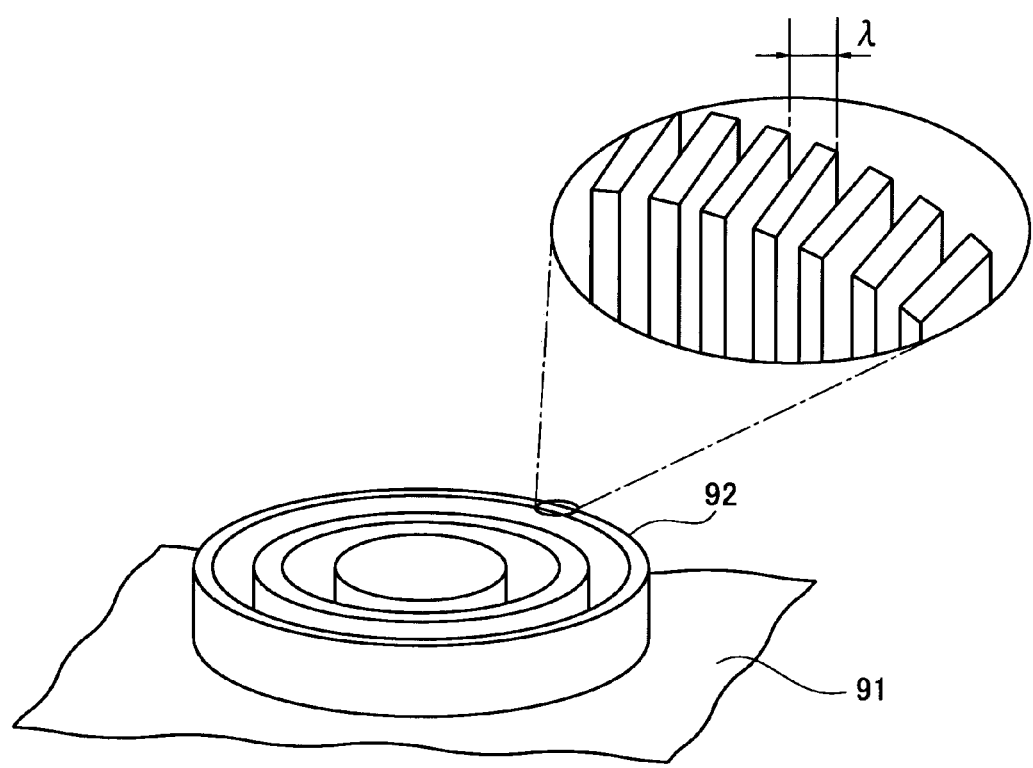
FIG. 20 is a perspective view illustrating a low-pass filter having a periodic structure with a period smaller than a wavelength.

Furthermore, the polarization-selective diffracting grating is not limited to the combinations of the above-described isotropic material and birefringent material, and a diffracting grating using a sub-wavelength structure may be used. That is, as shown in FIG. 20, the polarization selectivity can be achieved by superimposing the diffracting structure 92 having a pitch larger than the wavelength of the structure formed on the plate 91 with a periodic structure having a period (λ) shorter than the wavelength. By using such a method, simple structure of the polarization selective diffracting grating can be achieved so that low cost and thin low-pass filter can be achieved.

The first image may be an image regarding polarization information and the second image is an image regarding brightness information.

Figure 21:
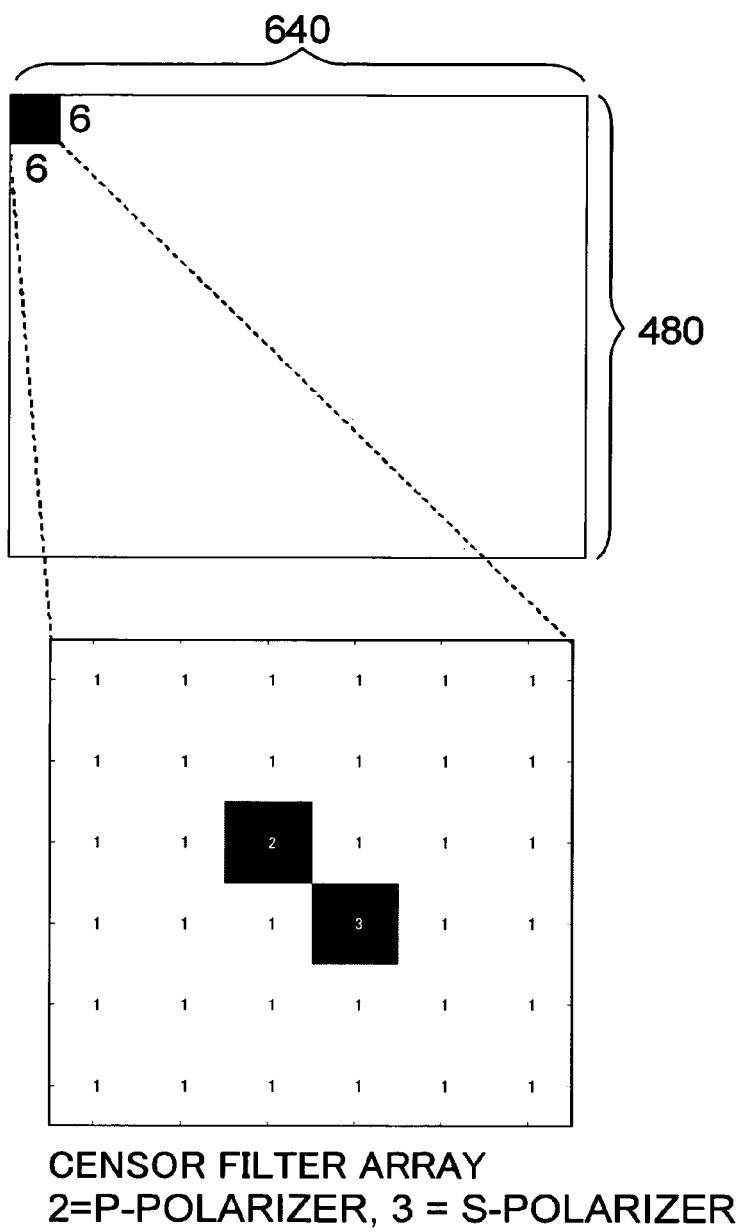
FIG. 21 is an explanatory view explaining a structure of a filter array having a period of 6×6 in a second embodiment.

Hereinafter, a structure of a filter array of the imaging element will be explained. As shown in FIG. 21, every array period of 6×6 has a pixel having a filter configured to transmit a P-polarized light and a pixel having a filter configured to transmit a S-polarized light at a center of the array period. Other pixels (referred to as Y pixels) have no filter function. It is important that the S-polarized filter and the P-polarized filter have also a spatial LPF effect and therefore, an average value of an intensity of the S-polarized light entering the array of the 6×6 and an average value of an intensity of the P-polarized light entering of the 6×6 pixels can be obtained. In a case where there is no LPF effect, even when performing the following processes, a remarkably large aliasing noise occurs in polarization information and therefore an information amount is largely decreased. It is not limited to a case where there is an actual filter configured to transmit a polarized light, and the above-described diffracting element, an SWS or the like may have a filter function.

Figure 22:
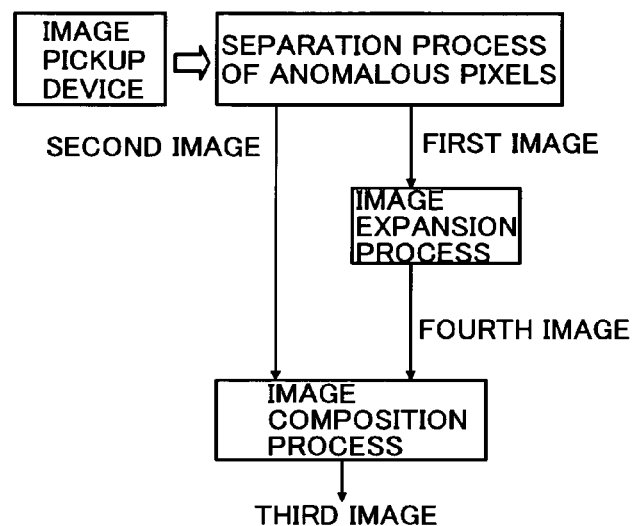
FIG. 22 is a view illustrating a flow to process an image imaged by an imaging element.

As the processes in this embodiment, as shown in FIG. 22, a separation process of anomalous pixels is performed. In the separation process, signals from the imaging element are separated into a second image formed by Y pixels and a first image formed by S-polarized pixels and P-polarized pixels. At this time, failure parts in the second image formed by the Y pixels are interpolated by peripheral Y pixels before the following image composition process and the second image has a same size (a number of pixels) as that of the imaging element (for example, 640×480, as shown in the above example).

Then, an image expansion process is performed to expand the first image formed by the S-polarized pixels and P-polarized pixels such that the first image has a same size as the second image and then the image composition process is performed to form a third image and therefore brightness information and corresponding polarization information constituting the third image can be obtained.

In general, in a case where the polarization information is used for detecting a wet road surface to prevent a vehicle to be skidded, the polarization information is not required to have same resolution as the brightness information, but the brightness information is required to have high resolution because the brightness information is used for displaying an image or performing a road surface detection processing. In this case, the method in this embodiment is preferable because the high resolution brightness information and the polarization information having low resolution but no occurrence of aliasing noise can be obtained by one imaging apparatus.

The image composition process may include simply packing the brightness information and the polarization information having a same number of pixels each other and then passing the information to the following devices. The image composition process also may include assigning or providing the polarization information to the color difference information to display the color polarization information.

Figure 23:
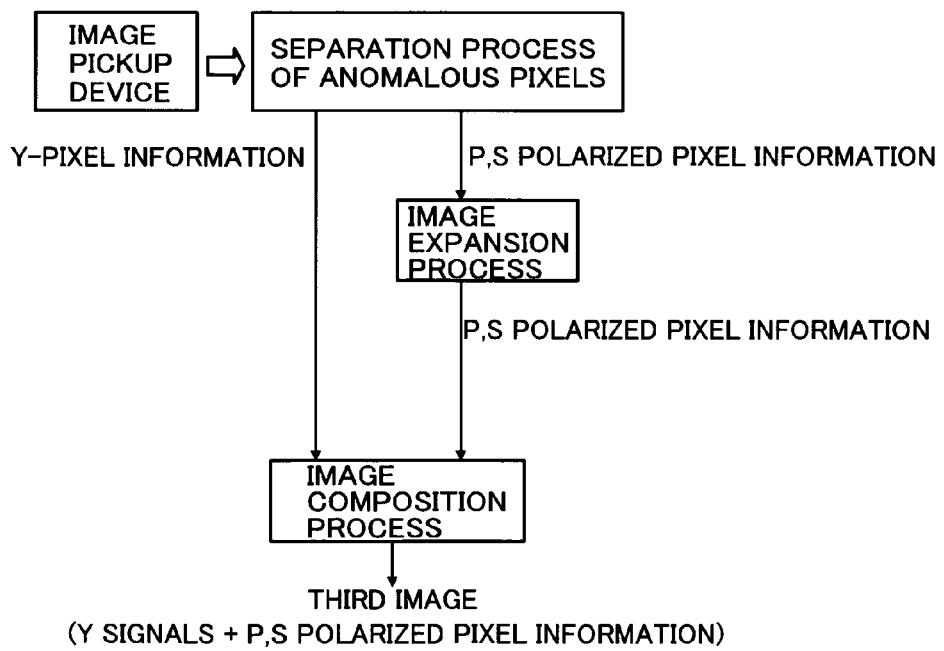
FIG. 23 is a view illustrating a flow to process an image imaged by an imaging element.
Figure 24:
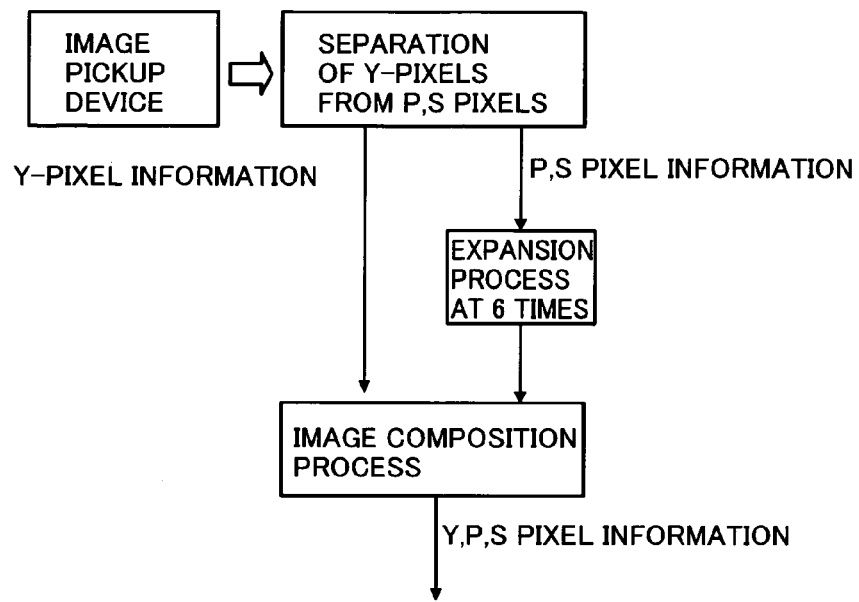
FIG. 24 is a view illustrating a flow to process an image imaged by an imaging element.

FIG. 23 shows an example where the first to third images are assigned or provided to the actual data. The case where the above-described filter array is used is more particularly shown in a process flow of FIG. 24.

The control device may be configured to perform an image reduction process to reduce the second image to form a fourth image and an image composition process to compose the first and fourth images to form a third image in addition to the separation process.

Figure 25:
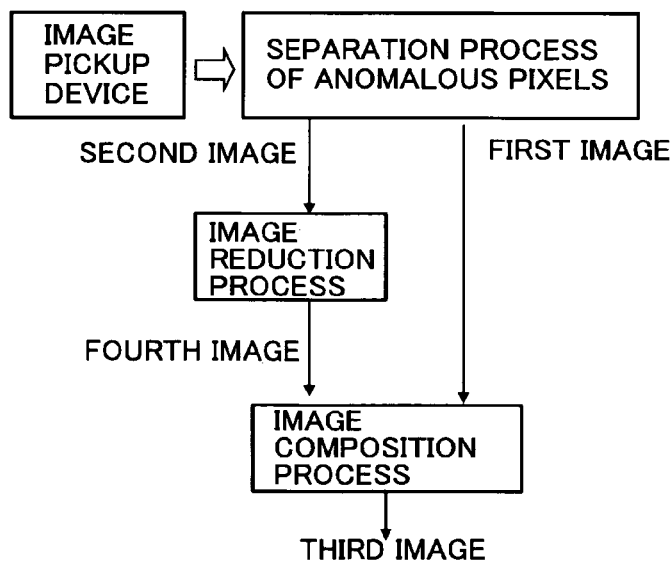
FIG. 25 is a view illustrating a flow to process an image imaged by an imaging element.

In a case where the brightness information is not required to have high resolution, a method shown in FIG. 25 is also preferable. That is, at first, a separation process of anomalous pixels is performed. In the separation process, signals from the imaging element are separated into a second image formed by S-polarized pixels and a first image formed by P-pixels. At this time, failure parts in the second image formed by the Y pixels are interpolated by peripheral Y pixels before the following image composition process and the second image has a same size (a number of pixels) as the imaging element, for example, 640×480 pixels. Then, an image reduction process is performed to reduce the second image of the brightness information such that the second image has a same size as the first image formed by the S-pixels and the P-pixels to form the fourth image. Then the image composition process is performed to generate a third image constituted by the brightness information and the corresponding polarization information from the fourth image and the first image.

Figure 26A:
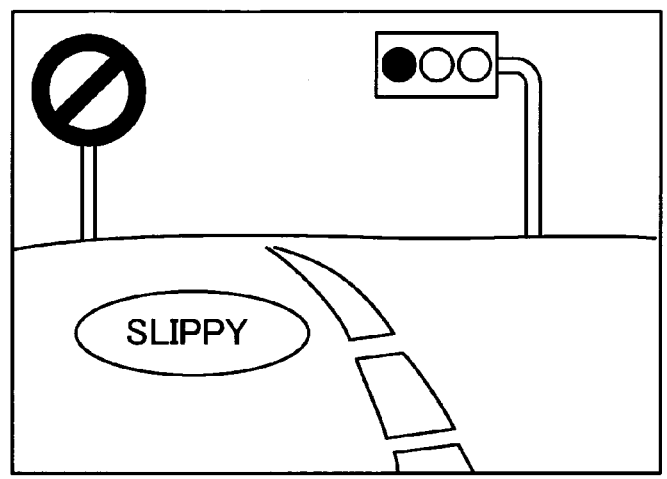
FIG. 26A is a view illustrating an example of an image imaged by a vehicle camera.

Next, for example, for a vehicle camera or the like, as shown in FIG. 26A, a color detection function to detect a color of a traffic light is necessary at an upper side of a screen and a function of detecting a wet road surface by using the polarization information is necessary at a lower side of the screen.

Figure 26B:
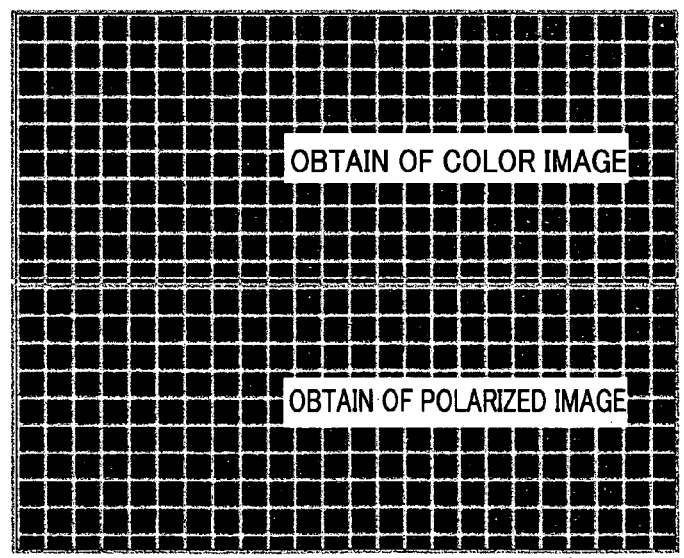
FIG. 26B is an explanatory view explaining a method for processing an imaged result.

In this case, as shown in FIG. 26B, it may be preferable that, for example, an upper side of an imaging element is provided with the filter array of the first embodiment to obtain a color image and a lower side of the imaging element is formed by the configuration where the low-pass filter is configured to extract a wavelength component of the predetermined light when focusing the predetermined light, or other combinations of the different filter arrays to be used in each area.

According to an embodiment of the present invention, since a low-pass filter configured to focus a predetermined light on a predetermined pixel on a light-receiving part of an imaging element is provided, high resolution and sensitivity of the imaging element can be achieved. Moreover, ratio of pixels without filter can be increased as well as the imaging element capable of achieving a normal color reproduction can be provided.

The invention claimed is:

1. An imaging element, comprising:
    a light receiving surface having a plurality of pixels; and
    a low-pass filter device configured to
        focus a predetermined light on a predetermined pixel of the plurality of pixels of the light-receiving surface,
        extract a wavelength component of the predetermined light when focusing the predetermined light, and
        transmit light different than the wavelength component of the predetermined light such that the plurality of pixels evenly receives the light different from the wavelength component of the predetermined light.

2. The imaging element according to claim 1, wherein the low-pass filter device is configured to change a polarization-dependent characteristic depending on a polarization direction of the predetermined light.

3. The imaging element according to claim 2, wherein the polarization-dependent characteristic of the low-pass filter device is a characteristic to transmit only a predetermined polarized light component.

4. The imaging element according to claim 1, wherein
    the plurality of pixels of the imaging element are divided into a plurality of periods each having an anomalous pixel, and
    the low-pass filter device is configured to have an LPF characteristic such that a light amount of a light beam focused on the anomalous pixel configured to extract a predetermined wavelength component is larger than an average light amount of light beams of the predetermined wavelength component focused on pixels adjacent to the anomalous pixel entering within one period of the pixels of the imaging element.

5. An imaging apparatus comprising:
    a lens system;
    an imaging element configured to image a subject to form a subject image via the lens system; and
    a control device configured to process the subject image as image data, wherein
    the imaging element includes a light receiving surface having pixels and a low-pass filter device configured to focus predetermined light on a predetermined pixel of the pixels of the light-receiving surface,
    the control device is configured to perform a separation process to separate the subject image formed by the imaging element into a first image formed by the predetermined pixels and a second image formed by pixels other than the predetermined pixels, the control device is configured to perform an image expansion process to generate a fourth image by expanding the first image and an image composition process to compose the second and fourth images to form a third image in addition to the separation process, and the control device is configured to perform an image conversion process to convert color information of the second and third images into brightness information and to form a fifth image having brightness values of RGB in addition to the image expansion process and the image composition process.

6. The imaging apparatus according to claim 5, wherein the first image is an image regarding color information and the second image is an image regarding brightness information.

7. The imaging apparatus according to claim 5, wherein the first image is an image regarding polarization information and the second image is an image regarding brightness information.

8. The imaging apparatus according to claim 5, wherein the control device is configured to perform an image reduction process to reduce the second image to form a fourth image and an image composition process to compose the first and fourth images to form a third image in addition to the separation process.

9. An imaging apparatus, comprising:

a lens system;

an imaging element configured to image a subject to form a subject image via the lens system; and a control device configured to process the subject image as image data, wherein the imaging element includes a light receiving surface having pixels and a low-pass filter device configured to focus predetermined light on a predetermined pixel of the pixels of the light-receiving surface, the control device is configured to perform a separation process to separate the subject image formed by the imaging element into a first image formed by the predetermined pixels and a second image formed by pixels other than the predetermined pixels, and the control device is configured to perform an image expansion process to expand the first image to form a fourth image, an LPF process to apply an LPF processing to the second image to form a sixth image by removing high frequency component from the first image, and an image composition process to compose the fourth and sixth images to form a third image.

10. The imaging apparatus according to claim 9, wherein the control device is configured to perform an image conversion process to convert color information of the second and third images into brightness information to form a fifth image having brightness values of RGB in addition to the image expansion process, the LPF process and the image composition process.

11. The imaging apparatus according to claim 9, wherein the LPF process is a process to average brightness values of pixels within a small range in relation to a period in which the predetermined pixels are arranged.

12. The imaging apparatus according to claim 9, wherein the LPF process includes an image reduction process and an image expansion process.

* * * * *